US011362269B2

(12) United States Patent
Cai et al.

(10) Patent No.: US 11,362,269 B2
(45) Date of Patent: Jun. 14, 2022

(54) SPIN-ORBIT TORQUE DEVICE AND METHOD FOR OPERATING A SPIN-ORBIT TORQUE DEVICE

(71) Applicant: National University of Singapore, Singapore (SG)

(72) Inventors: Kaiming Cai, Singapore (SG); Hyunsoo Yang, Singapore (SG)

(73) Assignee: National University of Singapore, Singapore (SG)

( * ) Notice: Subject to any disclaimer, the term of this patent is extended or adjusted under 35 U.S.C. 154(b) by 54 days.

(21) Appl. No.: 16/994,120

(22) Filed: Aug. 14, 2020

(65) Prior Publication Data

US 2021/0050510 A1  Feb. 18, 2021

(30) Foreign Application Priority Data

Aug. 16, 2019  (SG) .......................... 10201907550X

(51) Int. Cl.
*H01L 43/10* (2006.01)
*G11C 11/16* (2006.01)
(Continued)

(52) U.S. Cl.
CPC ............ *H01L 43/10* (2013.01); *G11C 11/161* (2013.01); *G11C 11/1673* (2013.01);
(Continued)

(58) Field of Classification Search
None
See application file for complete search history.

(56) References Cited

U.S. PATENT DOCUMENTS 10,276,784 B1  4/2019  Yu et al.
10,347,824 B2  7/2019  Choi
(Continued)

FOREIGN PATENT DOCUMENTS

CN  109560193 A  4/2019
WO  2018080159 A1  5/2018
(Continued)

OTHER PUBLICATIONS

Baumgartner, M. et al., "Spatially and time-resolved magnetization dynamics driven by spin-orbit torques", Nat. Nanotech. Oct. 2017, pp. 980-986, 12.
(Continued)

*Primary Examiner* — Tan T. Nguyen
(74) *Attorney, Agent, or Firm* — Botos Churchill IP Law LLP

(57) ABSTRACT

A spin-orbit torque device 100 is described. In an embodiment, the spin-orbit torque device 100 comprises: a first pinning region 106 having a first fixed magnetization direction; a second pinning region 108 having a second fixed magnetization direction which is in a different direction to the first fixed magnetization direction; a magnetic layer 102 having a switchable magnetization direction; and a spin source layer 104 configured to generate a spin current for propagating a domain wall between the first and second pinning regions 106, 108 to switch the switchable magnetization direction of the magnetic layer 102 between the first and second fixed magnetization directions.

18 Claims, 22 Drawing Sheets

(51) Int. Cl.
    H01L 43/06      (2006.01)
    H01L 43/04      (2006.01)
    H01L 27/22      (2006.01)
    G11C 11/56      (2006.01)
    G11C 11/18      (2006.01)
(52) U.S. Cl.
    CPC .......... *G11C 11/1675* (2013.01); *G11C 11/18*
            (2013.01); *G11C 11/5607* (2013.01); *H01L*
            *27/222* (2013.01); *H01L 43/04* (2013.01);
            *H01L 43/06* (2013.01)

(56) References Cited

U.S. PATENT DOCUMENTS

| | | | |
|---|---|---|---|
| 10,354,709 B2 | 7/2019 | Wang et al. | |
| 2010/0320550 A1* | 12/2010 | Abraham | H01L 43/08 257/E29.323 |
| 2019/0088300 A1 | 3/2019 | Yang et al. | |
| 2019/0355895 A1* | 11/2019 | Song | G11C 11/1675 |
| 2021/0104344 A1* | 4/2021 | Nguyen | H01L 43/10 |

FOREIGN PATENT DOCUMENTS

| | | |
|---|---|---|
| WO | 2018136003 A1 | 7/2018 |
| WO | 2019106436 A1 | 6/2019 |

OTHER PUBLICATIONS

Beach, G. S. D. et al., "Dynamics of field-driven domain-wall propagation in ferromagnetic nanowires", Nat. Mater., Oct. 2005, pp. 741-744, 4.
Bergeard, N. et al., "Ultrafast angular momentum transfer in multisublattice ferrimagnets", Nat. Commun., Mar. 11, 2014, pp. 1-7, 3466, 5.
Binder, M. et al., "Magnetization dynamics of the ferrimagnet CoGd near the compensation of magnetization and angular momentum", Phys. Rev. B, 2006, pp. 1-5, 134404, 74.
Bläsing, R. et al., "Exchange coupling torque in ferrimagnetic Co/Gd bilayer maximized near angular momentum compensation temperature", Nat. Commun. 2018, pp. 1-8, 4984, 9.
Cai, K. et al., "Ultrafast and energy-efficient spin-orbit torque switching in compensated ferrimagnets", Nat. Electron., Jan. 2020, pp. 37-42, 3.
Caretta, L. et al., "Fast current-driven domain walls and small skyrmions in a compensated ferrimagnet", Nat. Nanotech. Dec. 2018, pp. 1154-1160, 13.
Cubukcu, M. et al., "Ultra-Fast Perpendicular Spin-Orbit Torque MRAM", IEEE Trans. Magn., Apr. 2018, pp. 1-4, 9300204, vol. 54, No. 4.
Decker, M. M. et al., "Time Resolved Measurements of the Switching Trajectory of Pt=Co Elements Induced by Spin-Orbit Torques", Phys. Rev. Lett. 2017, pp. 1-5, 257201, 118.
El-Ghazaly, A. et al., "Ultrafast magnetization switching in nanoscale magnetic dots", Appl. Phys. Lett., 2019, pp. 1-6, 232407, 114.
Finley, J. et al., "Spin-Orbit Torque Switching in a Nearly Compensated Heusler Ferrimagnet", Adv. Mater., 2018, pp. 1-6, 1805361, 31.
Finley, J. et al., "Spin-Orbit-Torque Efficiency in Compensated Ferrimagnetic Cobalt-Terbium Alloys", Phys. Rev. Applied, Nov. 2, 2016, pp. 1-6, 054001, 6.
Furuta, M. et al., "Size dependence of magnetization switching and its dispersion of Co/Pt nanodots under the assistance of radio frequency fields", J. Appl. Phys., 2014, pp. 1-9, 133914, 115.
Garello, K. et al., "Ultrafast magnetization switching by spin-orbit torques", Appl. Phys. Lett. 2014, 212402, pp. 1-5, vol. 105.
Globalfoundries STT-MRAM (https://www.mram-info.com/tags/globalfoundries).

Graves, C. E. et al., "Nanoscale spin reversal by non-local angular momentum transfer following ultrafast laser excitation in ferrimagnetic GdFeCo", Nat. Mater. Apr. 2013, pp. 293-298, 12.
Hirata, Y. et al., "Correlation between compensation temperatures of magnetization and angular momentum in GdFeCo ferrimagnets", Phys. Rev. B, 2018, pp. 1-6, 220403(R), 97.
Kim, J.-H. et al., "Spin-orbit torques associated with ferrimagnetic order in Pt/GdFeCo/ MgO layers", Sci. Rep., 2018, pp. 1-8, 6017, 8.
Kim, K. et al., "Fast domain wall motion in the vicinity of the angular momentum compensation temperature of ferrimagnets", Nat. Mater., Dec. 2017, pp. 1187-1192, 16.
Lee, J. M. et al., "Field-Free Spin-Orbit Torque Switching from Geometrical Domain-Wall Pinning", Nano Lett., Jun. 28, 2018, pp. 4669-4674, 18.
Lee, J. M. et al., "Oscillatory spin-orbit torque switching induced by field-like torques", Commun. Phys., 2018, pp. 1-7, 2, 1.
Liu, H. et al., "Dynamics of spin torque switching in all-perpendicular spin valve nanopillars", J. Magn. Magn. Mater., 2014, pp. 233-258, 358-359.
Liu, L. et al., "Spin-Torque Switching with the Giant Spin Hall Effect of Tantalum", Science, May 4, 2012, pp. 555-558, vol. 336.
Miron, I. M. et al., "Perpendicular switching of a single ferromagnetic layer induced by in-plane current injection", Nature, Aug. 11, 2011, pp. 189-193, vol. 476.
Mishra, R. et al., "Anomalous Current-Induced Spin Torques in Ferrimagnets near Compensation", Phys. Rev. Lett., Apr. 12, 2017, pp. 1-6, 167201, 118.
Oh, S.-H. et al., "Coherent terahertz spin-wave emission associated with ferrimagnetic domain wall dynamics", Phys. Rev. B 2017, pp. 1-5, 100407(R), 96.
Oh, S.-H. et al., "Ferrimagnetic Domain Wall Motion Induced by Damping-like Spin-orbit Torque", J. Magn. 2018, pp. 196-200, 23.
Radu, I. et al., "Transient ferromagnetic-like state mediating ultrafast reversal of antiferromagnetically coupled spins", Nature, Apr. 14, 2011, pp. 205-208, vol. 472.
Roschewsky, N. et al., "Spin-orbit torque switching of ullralarge-thickness ferrimagnetic GdFeCo", Phys. Rev. B, 2017, pp. 1-5, 064406, 96.
Samsung starts shipping 28nm embedded MRAM memory (https://www.mram-info.com/samsung-startsshipping-28nm-embedded-mram-memory).
Shi, S. et al., "Fast Low-Current Spin-Orbit-Torque Switching of Magnetic Tunnel Junctions through Atomic Modifications of the Free-Layer Interfaces", Phys. Rev. Applied, Jan. 30, 2018, pp. 1-6, 9, 011002.
Siddiqui, S. A. et al., "Current-Induced Domain Wall Motion in a Compensated Ferrimagnet", Phys. Rev. Lett. Jul. 30, 2018, pp. 1-5, 057701, 121.
Thielemann-Kühn, N. et al., "Ultrafast and Energy-Efficient Quenching of Spin Order: Antiferromagnetism Beats Ferromagnetism", Phys. Rev. Lett. 2017, pp. 1-6, 197202, 119.
Torrejon, J. et al., "Tunable inertia of chiral magnetic domain walls", Nat. Commun. Nov. 24, 2016, pp. 1-7, 13533, 7.
Wu, H. et al., "Spin-Orbit Torque Switching of a Nearly Compensated Ferrimagnet by Topological Surface States", Adv. Mater., 2019, pp. 1-6, 1901681, 31.
Yang, Y. et al., "Ultrafast magnetization reversal by picosecond electrical pulses", Sci. Adv., Nov. 3, 2017, pp. 1-7, e1603117, 3.
Yoon, J. et al., "Anomalous spin-orbit torque switching due to field-like torque-assisted domain wall reflection", Sci Adv., Apr. 21, 2017, pp. 1-6, e1603099, 3.
Zheng, Z. et al., "Proposal of an ultra-fast all spin logic device based on RE-TM ferrimagnetic material.", IEEE International Magnetics Conference (INTERMAG), Singapore, 2018, 1.
Zhu, Z. et al., "Theoretical proposal for determining angular momentum compensation in ferrimagnets", Phys. Rev. B, May 7, 2018, pp. 1-4, 184410, 97.

* cited by examiner

SPIN-ORBIT TORQUE DEVICE AND METHOD FOR OPERATING A SPIN-ORBIT TORQUE DEVICE

CROSS REFERENCE TO RELATED APPLICATIONS

The present application claims priority from Singapore Patent Application No. 10201907550X, filed Aug. 16, 2019, the disclosure of which is incorporated herein by reference.

TECHNICAL FIELD

The present disclosure relates to a spin-orbit torque device and also a method for operating a spin-orbit torque device.

BACKGROUND

Spintronics aims to develop energy efficient as well as high-speed magnetic logic and memory devices. The core of non-volatile magnetic memory or logic cell is a magnetic tunnel junction (MTJ). Spin-transfer torque magnetic random access memory (STT-MRAM), which uses the MTJ structure, is a candidate to replace existing static random access memory (SRAM). However, it suffers from limitations such as nanosecond-scale incubation delay, undesirable writing due to the use of a same channel for both reading and writing currents, as well as reliability issues caused by typical high current densities used.

To overcome such issues, spin-orbit torque magnetic random access memory (SOT-MRAM) has been proposed. The SOT-MRAM has negligibly small incubation time with separate paths for writing and reading data, thereby enabling faster writing speed and improved endurance and reliability as compared to the STT-MRAM. Nonetheless, conventional ferromagnetic spin-orbit torque (SOT) systems exhibit magnetization dynamics in the range of gigahertz which constraint an operational speed of such SOT systems. An antiferromagnet, on the other hand, exhibits terahertz magnetization dynamics which potentially offers faster operational speed but poses a challenge for detecting its magnetization for use in a SOT system. For example, a readout signal via anisotropic magnetoresistance (AMR) for an antiferromagnet is not sufficient for fast reading and is not fully compatible with the conventional MTJ-based device scheme.

Further, although previously reported SOT systems had obtained high switching speeds, these were attained at the expense of using a high current density which is unsuitable for practical applications. Moreover, the SOT induced magnetization switching generally requires an in-plane external magnetic field to break the symmetry if the magnetic layer has a perpendicular magnetic anisotropy. The presence of an external magnetic field causes problems in scaling down SOT devices for high density device integration.

It is therefore desirable to provide a spin-orbit torque device and a method for operating the spin-orbit torque device which address the aforementioned problems and/or provides a useful alternative. Further, other desirable features and characteristics will become apparent from the subsequent detailed description and the appended claims, taken in conjunction with the accompanying drawings and this background of the disclosure.

SUMMARY

Aspects of the present application relate to a spin-orbit torque device and also a method for operating a spin-orbit torque device.

In accordance with a first aspect, there is provided a spin-orbit torque device comprising: a first pinning region having a first fixed magnetization direction; a second pinning region having a second fixed magnetization direction which is in a different direction to the first fixed magnetization direction; a magnetic layer having a switchable magnetization direction; and a spin source layer configured to generate a spin current for propagating a domain wall between the first and second pinning regions to switch the switchable magnetization direction of the magnetic layer between the first and second fixed magnetization directions.

By incorporating the first and second pinning regions in the spin-orbit torque device, the switchable magnetization direction of the magnetic layer can be switched between the first and second fixed magnetization directions by the propagation of the domain wall, thereby enabling deterministically switching of the switchable magnetization direction of the magnetic layer without using an external magnetic field. Moreover, since the spin current for propagating the domain wall between the first and second pinning regions to switch the switchable magnetization direction of the magnetic layer is generated from the spin source layer, the read and write operations for the SOT device do not share a same current path and therefore a reliability of the SOT device is improved. Further, the first and second pinning regions enable pinning of the domain wall and thereby facilitate a continuous operation of the SOT device. To elaborate, as an example, the switchable magnetization direction is initialized to be in the second fixed magnetization direction. To deterministically switch the switchable magnetization direction from the second fixed magnetization direction to the first fixed magnetization direction, a domain wall initially pinned at the first pinning region is propagated from the first pinning region towards the second pinning region. In this process, the domain of the first pinning region advances with the domain wall towards the second pinning region, thereby switching the switchable magnetization direction from the second fixed magnetization direction to the first fixed magnetization direction. The domain wall continues to propagate towards the second pinning region until it is pinned at the second pinning region. The process is then ready to be repeated again in a reverse direction with the domain wall propagating from the second pinning region back to the first pinning region. The magnetization direction of the magnetic layer can therefore be switched from the second fixed magnetization direction to the first fixed magnetization direction and vice versa in a continuous manner to allow a continuous operation of the SOT device. These features enable the SOT device to achieve reliable deterministic switching without the use of an external magnetic field, thereby providing high device performances for practical applications.

The switchable magnetization direction may be initialized to the second fixed magnetization direction, and the magnetic layer may be adapted to interact with the spin current to propagate the domain wall from the first pinning region towards the second pinning region to switch the switchable magnetization direction from the second fixed magnetization direction to the first fixed magnetization direction.

The switchable magnetization direction may be initialized to the first fixed magnetization direction, and the magnetic layer may be adapted to interact with the spin current to propagate the domain wall from the second pinning region towards the first pinning region to switch the switchable magnetization direction from the first fixed magnetization direction to the second fixed magnetization direction.

The first fixed magnetization direction and the second fixed magnetization direction may be opposite to each other.

The magnetic layer may comprise a switchable region formed between the first and second pinning regions, the first pinning region may comprise a first pinning site and the second region may comprise a second pinning site, the first pinning site may be adapted to pin the domain wall at a boundary between the first pinning region and the switchable region, and the second pinning site may be adapted to pin the domain wall at a boundary between the second pinning region and the switchable region.

The first pinning region or the second pinning region may be formed by geometrical modification or by ion-doping. The geometrical modification may be used to change the magnetic properties, current distribution, and/or domain wall surface energy of the first and/or second pinning region as compared to the switchable region, and the ion-doping may be used to modify the magnetic properties of the first and/or second pinning region such as the magnetic anisotropy direction and energy of the first and/or second pinning region as compared to the switchable region.

The first pinning region or the second pinning region may be formed as a region having a different width or a different thickness to that of the switchable region.

The spin-orbit torque device may comprise: a reference magnetic layer having a fixed reference magnetization direction; and a tunneling barrier layer sandwiched between the reference magnetic layer and the magnetic layer, wherein the switchable magnetization direction is switchable between the first fixed magnetization direction and the second fixed magnetization direction to provide a low resistance state and a high resistance state of the spin-orbit torque device, the low resistance state being a state in which the switchable magnetization direction is in the same direction as the fixed reference magnetization direction and the high resistance state being a state in which the switchable magnetization direction is in an opposite direction as the fixed reference magnetization direction.

The spin-orbit torque device may comprise an interfacial layer formed between the magnetic layer and the spin source layer, the interfacial layer comprising an interfacial alloy, or one or more monatomic layers.

The spin source layer may comprise one of: a heavy metal, an antiferromagnet, a topological insulator, a two-dimensional material, and a heterostructure.

The switchable magnetization direction may be perpendicular to a planar surface of the magnetic layer.

The magnetic layer may comprise a compensated ferrimagnet with a net magnetization below 50 emu/cm$^3$.

The magnetic layer may comprise $Co_{100-x}Gd_x$ where x has a range of 24 to 27 (i.e. $24 \leq x \leq 27$).

The compensated ferrimagnet may have an angular momentum compensation temperature between 20° C. to 80° C.

The spin current may be generated from an electric current, the electric current may comprise a sub-nanosecond current pulse having a pulse duration between 0.1 ns to 2 ns and a current density between $0.2 \times 10^{12}$ A m$^{-2}$ to $1 \times 10^{12}$ A m$^{-2}$.

In accordance with a second aspect, there is provided a spin-orbit torque magnetic memory device comprising: a reference magnetic layer having a fixed reference magnetization direction; a compensated ferrimagnetic layer having a net magnetization below 20 emu/cm$^3$, the compensated ferrimagnetic layer comprising a switchable region having a switchable magnetization direction, a first pinning region and a second pinning region, the first pinning region having a first fixed magnetization direction and the second pinning region having a second fixed magnetization direction different from the first fixed magnetization direction; a tunneling barrier layer sandwiched between the reference magnetic layer and the magnetic layer; and a spin source layer arranged to generate a spin current for propagating a domain wall between the first and second pinning regions to switch the switchable magnetization direction of the magnetic layer between the first fixed magnetization direction and the second fixed magnetization direction to provide a low resistance state and a high resistance state of the spin-orbit torque memory device, the low resistance state having a smaller magnetization angle between the switchable magnetization direction and the fixed reference magnetization direction than that of the high resistance state.

The switchable magnetization direction may be initialized to the second fixed magnetization direction, and the magnetic layer may be adapted to interact with the spin current to propagate the domain wall from the first pinning region towards the second pinning region to switch the switchable magnetization direction from the second fixed magnetization direction to the first fixed magnetization direction.

In accordance with a third aspect, there is provided a method for operating the aforementioned spin-orbit torque device or spin-obit torque magnetic memory device, the method comprising: (i) initializing the first fixed magnetization direction of the first pinning region and the second fixed magnetization direction of the second pinning regions to be in opposite directions; (ii) initializing the switchable magnetization direction to the second fixed magnetization direction; and (iii) passing an electric current through the spin source layer to generate the spin current to propagate the domain wall from the first pinning region towards the second pinning region to switch the switchable magnetization direction from the initialized second fixed magnetization direction to the first fixed magnetization direction.

The method may comprise: passing another electric current through the spin source layer to generate another spin current to propagate the domain wall from the second pinning region towards the first pinning region to switch the switchable magnetization direction from the first fixed magnetization direction to the second fixed magnetization direction.

The electric current may comprise a sub-nanosecond current pulse having a pulse duration between 0.1 ns to 2 ns and a current density between $0.2 \times 10^{12}$ A m$^{-2}$ to $1 \times 10^{12}$ A m$^{-2}$.

It should be appreciated that features relating to one aspect may be applicable to the other aspects. Embodiments therefore provide a spin-orbit torque device comprising a first pinning region having a first fixed magnetization direction and a second pinning region having a second fixed magnetization direction, where the switchable magnetization direction of the magnetic layer can be switched between the first and second fixed magnetization directions by the propagation of the domain wall in the spin source layer. By incorporating the first and second pinning regions in the spin-orbit torque device, the switchable magnetization direction of the magnetic layer can be deterministically switched between the first and second fixed magnetization directions without the use of an external magnetic field. Moreover, since the spin current for propagating the domain wall between the first and second pinning regions to switch the switchable magnetization direction of the magnetic layer is generated from the spin source layer, the read and write operations for the SOT device do not share a same current path and therefore a reliability of the SOT device is improved. Further, the first and second pinning regions enable pinning of the domain wall which facilitates a continuous operation of the SOT device.

BRIEF DESCRIPTION OF THE DRAWINGS

Embodiments will now be described, by way of example only, with reference to the following drawings, in which:

FIG. 1A shows a three-dimensional structure of the SOT device including pinning regions A and B, and FIG. 1B shows a two-dimensional structure of a cross-section of the SOT device to illustrate read and write operations in the SOT device;

FIG. 3A shows an initial state of a switchable region in a magnetic layer of the SOT device having a switchable magnetization direction same as the pinning region B (e.g. in a "down" direction), FIG. 3B shows propagation of a domain wall from the pinning region A towards the pinning region B and switching of the switchable magnetization direction from the "down" direction to the "up" direction, and FIG. 3C shows the switchable magnetization direction of the switchable region having switched to the "up" direction and pinning of the domain wall at a pinning site of the pinning region B;

FIG. 5A shows a schematic diagram of atomic distribution in the ferrimagnetic alloy CoGd, FIG. 5B shows a schematic diagram of exchange coupling in the ferrimagnetic alloy CoGd, and FIG. 5C shows a schematic diagram of spin angular momentum transfers through anti-ferromagnetic coupling in the ferrimagnetic alloy CoGd;

FIG. 8A shows a plot of calculated domain wall velocity as a function of current density and FIG. 8B shows a plot of calculated domain wall velocity as a function of Gd composition of the CoGd ferrimagnetic alloy;

FIG. 9A shows plots of saturation magnetization of the ferrimagnetic CoGd films and corresponding Kerr signal change as a function of Gd concentration, and FIG. 9B shows plots of magnetization of the ferrimagnetic CoGd films as a function of temperature for different CoGd compositions;

FIG. 10A shows plots of calculated net magnetization $M_S$ and net angular momentum $A_S$ as a function of Gd concentration and FIG. 10B shows plots of net magnetization $M_S$ and net angular momentum $A_S$ as a function of temperature for two different CoGd compositions;

FIG. 11A shows a schematic diagram of the MOKE measurement setup, FIG. 11B shows plots of static MOKE Kerr signal as a function of perpendicular magnetic field $H_z$ for $Co_{100-x}Gd_x$ films at room temperature (i.e. T=300 K), FIG. 11C shows plots of coercive field and the change of Kerr signal $\Delta V_{Kerr}$ (top panel), as well as the net magnetization $M_S$ and net angular momentum $A_S$ (bottom panel) as a function of Gd composition, FIG. 11D shows a plot of static MOKE Kerr signal as a function of d.c. current density to illustrate magnetization switching in a $Co_{76}Gd_{24}$ film, and FIG. 11E shows plots of temporal evolution of time-resolved Kerr signal for different pulse durations with a current density of $J=4.2\times10^{11}$ A m$^{-2}$ in an external magnetic field $H_x=-1444$ Oe;

FIG. 12A shows plots of temporal evolutions of MOKE signals for different pulse widths for a $Co_{76}Gd_{24}$ device with an external magnetic field $H_x=1444$ Oe and a current density $J=4.2\times10^{11}$ A m$^{-2}$, FIG. 12B shows plots of switching probability as a function of current pulse duration for different current densities for a $Co_{80.5}Gd_{19.5}$ device evaluated using anomalous Hall measurements, and FIG. 12C shows plots of switching energy consumption per unit area and switching time for ferromagnetic and ferrimagnetic systems;

FIG. 14A shows an optical image of the $Co_{76}Gd_{24}$ wire, FIG. 14B shows temporal evolution of time-resolved MOKE signals for two different laser spot positions at x=0.5 µm and x=2.5 µm, and FIG. 14C shows a plot of domain wall arrival time to as a function of the central position x of the laser spot;

FIG. 15A shows a schematic diagram of the laser spot used in MOKE measurements on a portion of the $Co_{76}Gd_{24}$ wire, and FIG. 15B shows a plot of measured temporal evolution of MOKE signal in the $Co_{76}Gd_{24}$ wire with a current density of ~2.91×10$^{11}$ A m$^{-2}$ and a pulse duration of 5 ns;

FIG. 16A shows plots of domain wall velocities at different positions along a CoGd wire, FIG. 16B shows a plot of domain wall velocity as a function of the current density at the center of the $Co_{76}Gd_{24}$ wire, and FIG. 16C shows plots of the domain wall velocity and switching time as a function of Gd composition;

FIG. 17A shows a plot of time-resolved MOKE signals for a $Co_{75}Gd_{25}$ wire and FIG. 17B shows a plot of time-resolved MOKE signals for a $Co_{74}Gd_{26}$ wire;

FIG. 18A shows plots of the measured switching probability of a patterned $Pt/Co_{80.5}Gd_{19.5}$ device as a function of current pulse duration for three different current densities under an external magnetic field $H_x$=−630 Oe, FIG. 18B shows plots of the measured critical switching current density and pulse width with $H_x$=−630 Oe for the $Pt/Co_{80.5}Gd_{19.5}$ device, and FIG. 18C shows plots of the critical switching current density as a function of $1/\tau_c$ with different magnetic fields for the $Pt/Co_{80.5}Gd_{19.5}$ device;

FIG. 19A shows a plot of domain wall velocity as a function of current density J with pulse duration $\tau_a$=5 ns for $H_x$=722 Oe, and FIG. 19B shows a plot of domain wall velocity (v~$D/t_{sw}$) as a function of pulse duration $\tau_p$ with J=4.2×10$^{11}$ A m$^{-2}$ and $H_x$=722 Oe;

FIG. 20A shows a schematic diagram illustrating heat transfer and dissipation in the ferrimagnetic CoGd device, FIG. 20B shows plots of temperature response for rectangular current pulses with different duration $\tau_p$ and amplitude $I_p$, and FIG. 20C shows a plot of maximum calculated temperature as a function of current pulse amplitude $I_p$ with a pulse duration of $\tau_p$=5 ns; FIG. 21A shows a schematic diagram of a Hall-bar device with a CoGd nano-pillar formed at a center of the Hall-bar device, FIG. 21B shows a plot of extracted current pulse durations at a switching probability $P_{SW}$ of 50% for different nano-pillar diameters using a pulse current density $J_p$=7.84×10$^{11}$ A m$^{-2}$ and an external magnetic field $H_x$=−820 Oe, FIG. 21C shows a plot of estimated energy consumption for different nano-pillar diameters, and FIG. 21D shows plots of characteristic switching time energy consumption, and critical d.c. switching current density $J_{th}$ for different nano-pillar diameters.

DETAILED DESCRIPTION

An exemplary embodiment relates to a spin-orbit torque device and also a method for operating a spin-orbit torque device.

In this disclosure, an ultrafast and energy-efficient spin-orbit torque magnetization switching in a spin-orbit torque (SOT) device is demonstrated using an exemplary compensated ferrimagnetic alloy CoGd, where a magnetization direction of a CoGd magnetic layer of the SOT device can be switched by applying a current in a non-magnetic spin source layer of the SOT device. An exemplary SOT device and its operation are discussed in relation to FIGS. 1A to 4. The mechanism of this SOT magnetization switching is discussed using a theoretical model in relation to FIGS. 5A to 8B. Experimental data for demonstrating this ultrafast fast SOT switching using time-resolved and switching probability measurements in the representative ferrimagnet CoGd are discussed in relation to FIGS. 9A to 20C. Further, scaling of the ferrimagnetic based devices on optimizing switching time and energy-consumption is discussed in relation to FIGS. 21A to 21D.

Figure 1A:
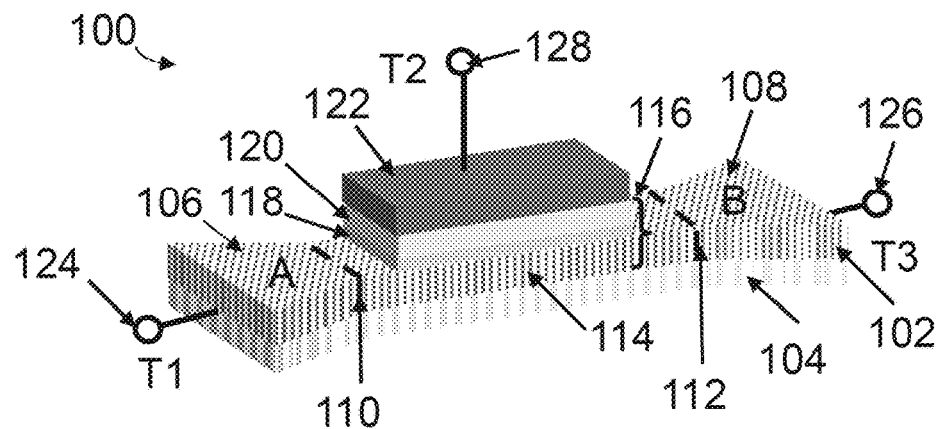
FIGS. 1A and 1B show schematic structures of a spin-orbit torque (SOT) device in accordance with an embodiment, where
Figure 1B:
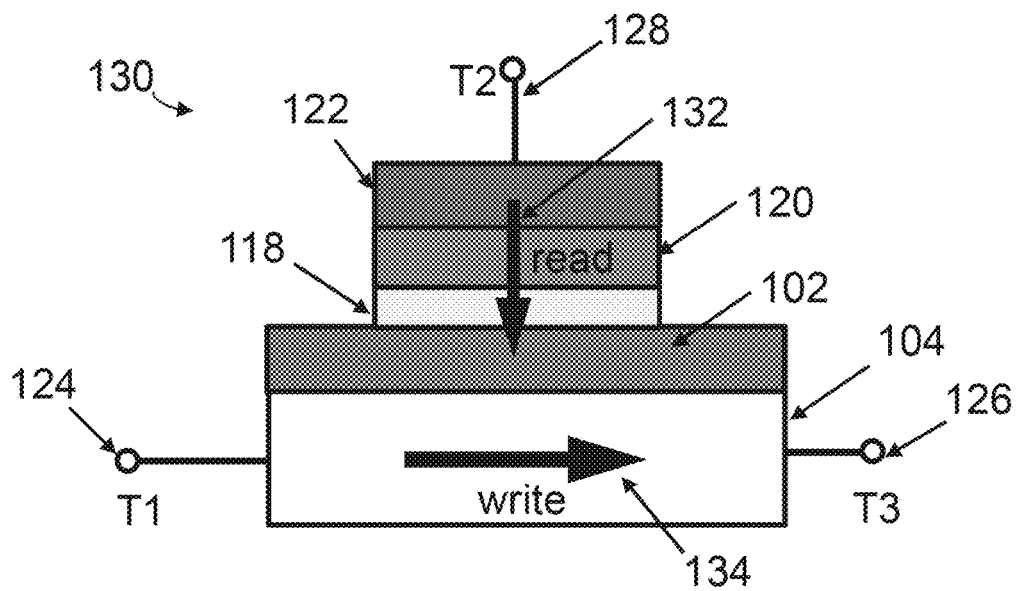

FIGS. 1A and 1B show schematic structures of a spin-orbit torque (SOT) device 100 in accordance with an embodiment, where FIG. 1A shows a three-dimensional structure of the SOT device 100 and FIG. 1B shows a two-dimensional structure 130 of a cross-section of the SOT device 100.

The SOT device 100 comprises a magnetic layer 102 formed on a spin source layer 104. The magnetic layer 102 comprises a first pinning region 106 (labelled as "A" in FIG. 1A) and a second pinning region 108 (labelled as "B" in FIG. 1A). Each of the first pinning region 106 and the second pinning region 108 has a pinning site 110, 112, respectively. The first pinning region 106 has a first fixed magnetization direction and the second pinning region 108 has a second fixed magnetization direction. The second fixed magnetization direction is in a different direction to the first fixed magnetization direction. As shown in FIG. 1A, the magnetic layer 102 comprises a switching region 114 between the first pinning region 106 and the second pinning region 108, the switching region having a switchable magnetization direction. As shown in FIG. 1A, the SOT device 100 comprises a magnetic tunnel junction heterostructure 116. The magnetic tunnel junction heterostructure 116 comprises the switchable region of the magnetic layer 114, a tunneling barrier layer 118, and a reference magnetic layer 120. The tunneling barrier layer 118 is formed on and is adjacent to the switchable region 114 of the magnetic layer 102 and is sandwiched between the reference magnetic layer 120 and the magnetic layer 102. The reference magnetic layer 120 has a fixed reference magnetization direction. The electrode layer 122 forms a contact to the tunnel junction heterostructure 116. The SOT device 100 is a three-terminal device, having two terminals 124, 126 (labelled as T1 and T3, respectively) electrically connected to two ends of the spin source layer 104 and a terminal 128 (labelled as T2) electrically connected to the electrode layer 122 of the tunnel junction heterostructure 116.

In the present embodiment, the magnetic layer 102 comprises a compensated ferrimagnet cobalt gadolinium (CoGd) alloy having a perpendicular magnetic anisotropy. In other words, the switchable magnetization direction of the magnetic layer 102 is in a direction perpendicular to a planar surface of the magnetic layer 102. The compensated ferrimagnet CoGd in the present embodiment has a net magnetization of below 50 emu/cm$^2$ and an angular momentum compensation temperature of between 20° C. to 80° C. The first fixed magnetization direction of the first pinning region 106 has an "up" direction and the second fixed magnetization direction of the second pinning region 108 has a "down" direction. In the present embodiment, the first fixed magnetization direction and the second fixed magnetization direction are therefore opposite to each other. The spin source layer 104 comprises a non-magnetic material such as a metal (e.g. platinum, Pt). The tunnel barrier layer 118 comprises an insulator such as MgO. The reference magnetic layer 120 comprises a ferromagnet such as cobalt iron boron (CoFeB) and the electrode layer 122 comprises a metal such as tantalum (Ta). In the present embodiment, the reference magnetic layer 120 has a fixed reference magnetization direction of the "down" direction. The switchable magnetization of the magnetic layer 102 between the first pinning region 106 and the second pinning region 108 can be switched between "up" and "down" directions. The pinning site 110 of the first pinning region 106 and the pinning site 112 of the second pinning region 108 are formed by an anti-notch structure as shown in FIG. 1A. The anti-notch structure uses geometrical modification which changes the magnetic properties, current distribution, and/or domain wall surface energy of the first and/or second pinning regions as compared to the switchable region 114 so as to create the respective pinning sites 110, 112 for pinning the domain wall. The first and second pinning regions 106, 108 function to confine the domain wall within the switchable region 114 so as to enable continuous operation of the SOT device 100.

FIG. 1B shows a schematic cross-section diagram 130 of the SOT device 100. A read/write operation can be explained using FIG. 1B.

The SOT device 100 based its operation on the principle of a magnetic tunnel junction (MTJ). As described above, the MTJ heterostructure 116 of the SOT device 100 comprises the switchable region 114 of the magnetic layer 102, the tunneling barrier layer 118 and the reference magnetic layer 120. The SOT device 100 functions as a magnetic memory device, where binary states "1" and "0" can be attained by electrically manipulating a relative alignment between the switchable magnetization direction of the magnetic layer 102 and the fixed reference magnetic direction of the reference magnetic layer 120. In particular, the electrical resistance of the MTJ is low when the switchable magnetization direction of the magnetic layer 102 is in a parallel alignment (i.e. same direction) with the fixed reference magnetic direction of the reference magnetic layer 120, and is high when the switchable magnetization direction of the magnetic layer 102 is in an anti-parallel alignment (i.e. opposite direction) with the fixed reference magnetic direction of the reference magnetic layer 120. The high and low resistance states of the MTJ represent the binary states typical of a memory device. For example, the high resistance state represents '1' and the low resistance state represents '0'. This is shown and discussed later in relation to FIG. 2, This stored data (i.e. "1" or "0" of the SOT device 100) can be readout by measuring the resistance state of the MTJ of the SOT device 100.

As discussed above, the high and low resistance states can be achieved by switching the switchable magnetization direction of the magnetic layer 102 with respect to that of the reference magnetic layer 120. In a typical spin-transfer torque random access memory device (STT-MRAM), a current flows through a MTJ of the STT-MRAM to switch a switchable magnetization of a free magnetic layer. In this arrangement, both the reading and writing current flow through a same path through the MTJ of the STT-MRAM and may therefore result in undesired writing during a reading process. Further, the high current density flowing through the tunnel barrier layer of the MTJ during a writing process may cause reliability issues of these STT-MRAM devices.

In contrast, in the SOT device 100, an in-plane electric current is injected into the spin source layer 104 from the terminal 124 (T1) towards the terminal 126 (T3) to manipulate the switchable magnetization of the magnetic layer 102. To do so, the in-plane electric current is converted to a spin current in the spin source layer 104 where the spin current accumulates at an interface between the spin source layer 104 and the magnetic layer 102. The spin current exerts a spin-torque on the adjacent magnetic layer 102 and switches the switchable magnetization of the magnetic layer 102. To read a resistance state of the SOT device 100, a current is injected from the terminal 128 (T2) to measure the resistance of the MTJ. Since the reading/writing processes involve two different current paths as described, undesired writing can be minimized during a reading process of the SOT device 100. This also serves to enhance a reliability of the tunnel barrier layer 118 since high electric currents are no longer injected through the tunnel barrier layer 118 during the writing processes.

Figure 2:
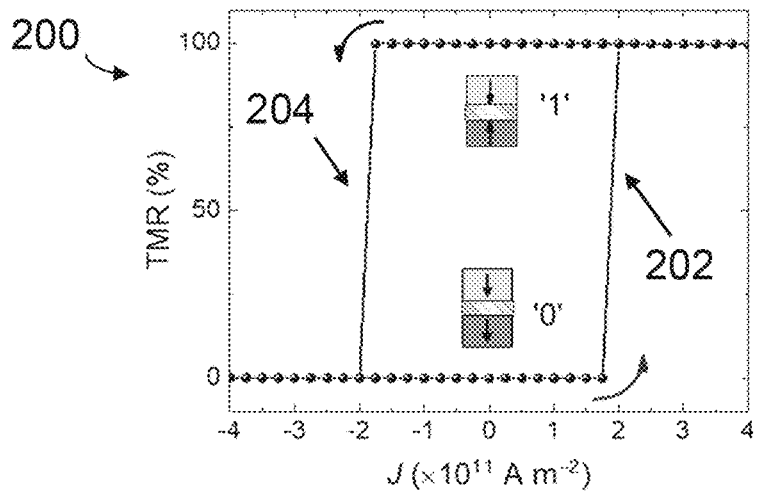
FIG. 2 shows a plot of tunneling magnetoresistance (TMR) as a function of current density injected in a spin source layer of the SOT device of FIG. 1 in accordance with an embodiment.

FIG. 2 shows a plot 200 of tunneling magnetoresistance (TMR) as a function of current density of the electric current injected in the spin source layer 104 of the SOT device 100. The plot 200 illustrates the different resistance states of the MTJ of the SOT device 100.

In the present embodiment where the fixed reference magnetization direction of the reference magnetic layer 120 is in the "down" direction, the switchable magnetization direction can be initialized in the "down" direction with a domain wall initially being pinned at the pinning site 110 of the first pinning region 106 (A). This provides the low resistance state "0" as shown in FIG. 2. As an electric current is injected from the terminal 124 (T1) towards the terminal 126 (T3) in the spin source layer 104, a spin current is generated from the electric current to propagate the domain wall from the first pinning region 106 (A) towards the second pinning region 108 (B). The magnetization direction of the switchable region 114 of the magnetic layer 102 is switched from the initial "down" direction to "up" direction by the domain expansion from the first pinning region 106 (A). The domain wall is eventually pinned at the pinning site 112 of the second pinning region 108 (B). This provides the high resistance state "1" as shown in FIG. 2 where the switchable magnetization direction of the magnetic layer 102 and the fixed reference magnetization direction of the reference magnetic layer 120 are in the anti-parallel alignment. This process is shown by the plot 202 in FIG. 2.

A writing process can subsequently be performed in an opposite manner. In this case, another electric current is injected in the spin source layer 104 in an opposite direction from the terminal 126 (T3) towards the terminal 124 (T1). A spin current is generated from this electric current to propagate the domain wall pinned at the pinning site 112 of the second pinning region 108 (B) towards the first pinning region 106 (A). The magnetization direction of the switchable region 114 is switched from the "up" direction to "down" direction by the domain expansion from the second pinning region 108 (B). The domain wall is eventually pinned at the pinning site 110 of the first pinning region 106 (A). This switches the high resistance state "1" back to the low resistance state "0" as shown in FIG. 2 where the switchable magnetization direction of the magnetic layer 102 and the fixed reference magnetization direction of the reference magnetic layer 120 are now in the parallel alignment. This process is shown by the plot 204 in FIG. 2.

Figure 3A:
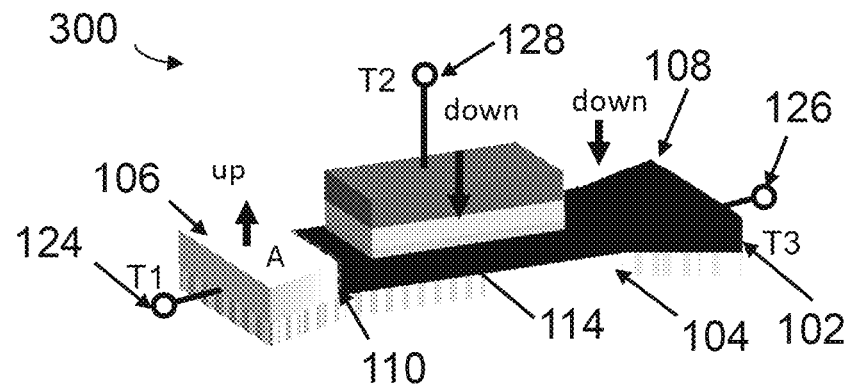
FIGS. 3A, 3B and 3C show schematic structures of the SOT device of FIG. 1 for demonstrating a writing operation in the SOT device in accordance with an embodiment, where
Figure 3B:
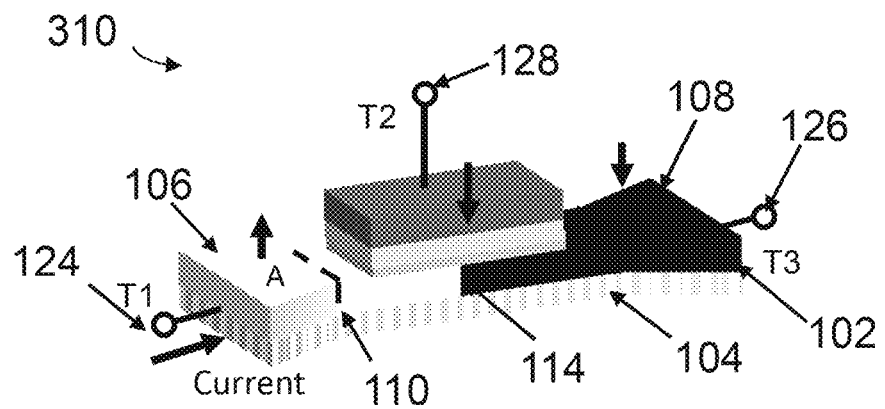
Figure 3C:
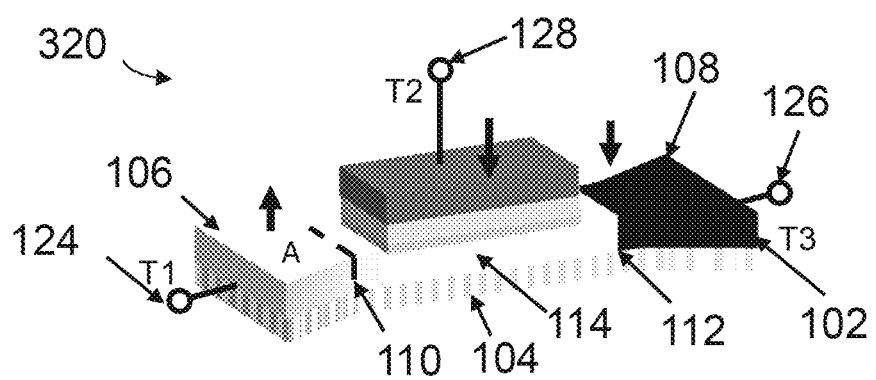

FIGS. 3A, 3B and 3C show schematic structures 300, 310, 320 of the SOT device 100 of FIG. 1 for demonstrating writing operations in the SOT device 100 as described above in relation to the process as shown by the plot 200 of FIG. 2.

FIG. 3A shows the initial state of the switchable region 114 in the magnetic layer 102 of the SOT device 100 having a switchable magnetization direction in the "down" direction, which is the same as the second pinning region 108 (B). The domain wall is initially pinned at the pinning site 110 of the first pinning region 106 (A). As an electric current is injected from the terminal 124 (T1) in the spin source layer 104, a spin current is generated from the injected electric current and cause the domain wall to propagate from the first pinning region 106 (A) towards the second pinning region 108 (B). This is shown in FIG. 3B. In this process, the propagation of the domain wall causes a magnetic domain with the "up" direction to expand towards the second pinning region 108 (B). The switchable magnetization direction of the switchable region 114 of the magnetic layer 102 is gradually switched from the "down" direction to the "up" direction of the first pinning region 106 (A) via domain expansion. Meanwhile, the resistance between the terminal 128 (T2) and the terminal 124 (T1) will be gradually changed, and eventually provides the high resistance state once the magnetization direction of the switchable region 114 is completely switched to the "up" direction. This is shown in FIG. 3C. The domain wall is eventually pinned at the pinning site 112 of the second pinning region 108 (B).

As described in relation to FIG. 2 above, an electric current with an opposite direction can drive the domain wall back from the second pinning region 108 (B) to the first pinning region 106 (A) to achieve the low resistance state of the SOT device 100. In this way, the switchable magnetization direction of the switchable region 114 of the magnetic layer 102 can be deterministically switched between the "up" and "down" directions without the use of an external magnetic field. Further, as described in the above operations, a same domain wall can be propagated to and fro between the first and second pinning regions 106, 108, this provides energy saving as a domain wall is not required to be created in every switching process.

Figure 4:
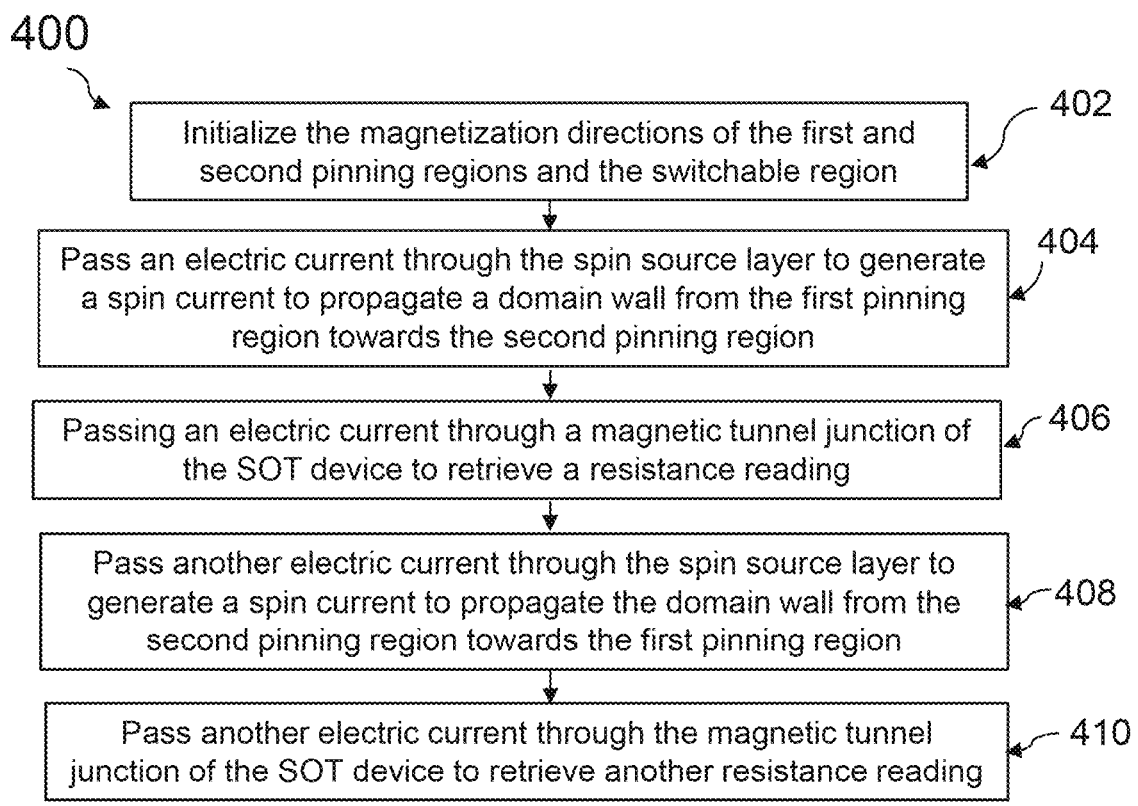
FIG. 4 shows a flowchart showing steps of a method for operating the SOT device of FIG. 1 in accordance with an embodiment.

FIG. 4 shows a flowchart showing steps of a method 400 for operating the SOT device 100 of FIG. 1. The method 400 summarizes and provides clarity on the operation processes described in relation to FIG. 2 and FIGS. 3A to 3C above.

In a step 402, the magnetization directions of the first and second pinning regions 106, 108 of the magnetic layer 102 are initialized to an anti-parallel alignment (i.e. the first fixed magnetization direction of the first pinning region and the second fixed magnetization direction of the second pinning region are in opposite directions), and the magnetization direction of switchable region 114 is initialized to the second fixed magnetization direction of the second pinning region 108 (B). This is for example as shown in FIG. 3A, where the first fixed magnetization direction and the second fixed magnetization direction are in the "up" and "down" direction, respectively. The domain wall in this step 402 is pinned at the pinning site 110 of the first pinning region 106 (A). In the present embodiment as described above, the fixed reference magnetization direction of the reference magnetic layer 120 is in the "down" direction. The switchable magnetization direction of the switchable region 114 of the magnetic layer 102 is therefore parallel to the fixed reference magnetization direction, and the SOT device 100 is in the "low" resistance state.

In a step 404, an electric current is passed through the spin source layer 104 to generate a spin current to propagate the domain wall from the first pinning region 106 (A) towards the second pinning region 108 (B) to switch the switchable magnetization direction of the magnetic layer 102 from the initialized second fixed magnetization direction (e.g. "down" direction) to the first fixed magnetization direction (e.g. "up" direction). This is for example as shown in FIGS. 3B and 3C. In this case, the electric current is injected at the terminal 124 (T1). The magnetic domain expands from the first pinning region 106 (A) towards the second pinning region 108 (B) as the domain wall propagates from the first pinning region 106 (A) towards the second pinning region 108 (B). The switchable magnetization of the switchable region 114 is gradually switched from the "down" direction to the "up" direction of the first pinning region 106 (A). The domain wall is eventually pinned at the pinning site 112 of the second pinning region 108 (B).

In a step 406, an electric current is passed through the MTJ of the SOT device 100 to retrieve a resistance reading. This provides a readout of the resistance state of the SOT device 100. In the present case, the readout will provide a high resistance state "1".

The steps 402 to 406 therefore describe a single set of write and read process to change the initial low resistance state "0" of the SOT device 100 to the high resistance state "1" of the SOT device 100 and to read a resistance state of the MTJ of the SOT device 100. This is for example described in relation to the plot 202 of FIG. 2.

To reverse the process and change the resistance state of the MTJ of the SOT device 100, for example, from the high resistance state "1" to the low resistance state "0", another electric current can be injected from the terminal 126 (T3) in an opposite direction.

In a step 408, another electric current is passed through the spin source layer 104 to generate another spin current to propagate the domain wall from the second pinning region 108 (B) towards the first pinning region 106 (A) to switch the switchable magnetization direction from the first fixed magnetization direction to the second fixed magnetization direction. In this case, the propagation of the domain wall expands the magnetic domain of the second pinning region 108 (B) towards the first pinning region 106 (A), thereby switches the switchable magnetization of the switchable region 114 from the "up" direction to the "down" direction of the second pinning region 108 (B). The domain wall is eventually pinned at the pinning site 110 of the first pinning region 106 (A). This switches the high resistance state "1" back to the low resistance state "0".

In a step 410, another electric current is passed through the MTJ of the SOT device 100 to retrieve another resistance reading to provide a readout of the resistance state of the SOT device 100. In this case, the readout will provide the low resistance state "0". The steps 408 and 410 therefore provide another set of write and read operation to change the resistance state of the SOT device 100 from the high resistance state "1" back to the low resistance state "0" and to read out a resistance state of the MTJ of the SOT device 100.

The above steps 402 to 410 can be repeated, as necessary, to change or read the resistance state of the SOT device 100. The SOT device 100 as described therefore functions as a magnetic memory storage device having binary states of high resistance state "1" and low resistance state "0", and the process steps 402 to 410 provide the write/read operations of this SOT magnetic memory device 100.

As described in FIG. 1, the magnetic layer 102 of the present embodiment comprises a compensated CoGd ferrimagnetic alloy. A compensated ferrimagnet is chosen for the following reasons. First, compensated ferrimagnets have a high SOT efficiency compared to their ferromagnetic counterparts. Second, compensated ferrimagnets exhibit a high domain wall (DW) velocity and mobility as shown in relation to the figures below. Third, ferrimagnets can be integrated using a MTJ structure for example as described in the SOT device 100, as they exhibit sufficient tunneling magnetoresistance (TMR) even at a compensation composition due to 3d itinerant electrons of transition metal sublattices.

Mechanisms of SOT Switching in Compensated Ferrimagnets

The following FIGS. 5A to 8B are related to mechanisms of SOT magnetization switching as exhibited in compensated ferrimagnets, such as CoGd used in the present embodiment.

Figure 5A:
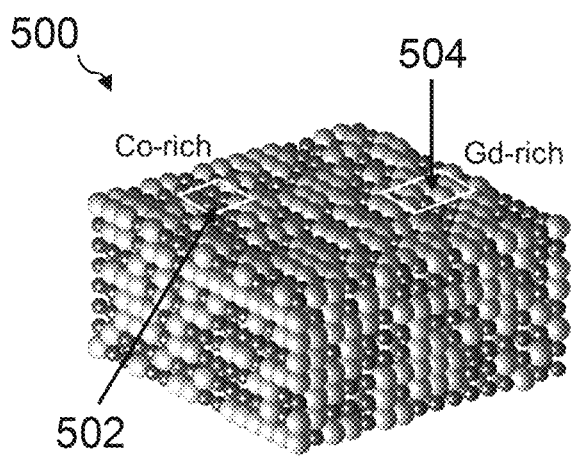
FIGS. 5A, 5B and 5C show schematic diagrams illustrating angular momentum transfer in a ferrimagnetic alloy cobalt gadolinium (CoGd) in accordance with an embodiment, where
Figure 5B:
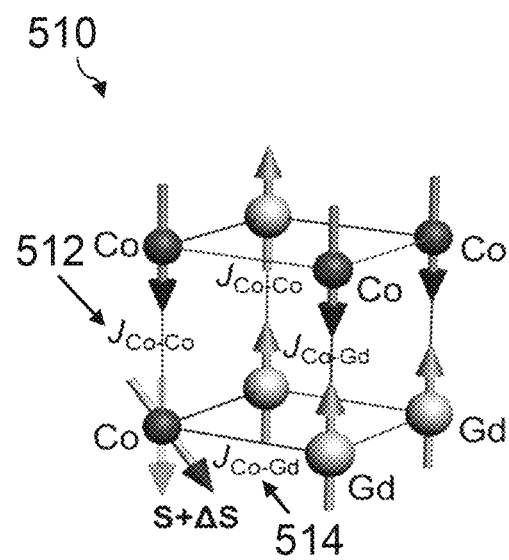
Figure 5C:
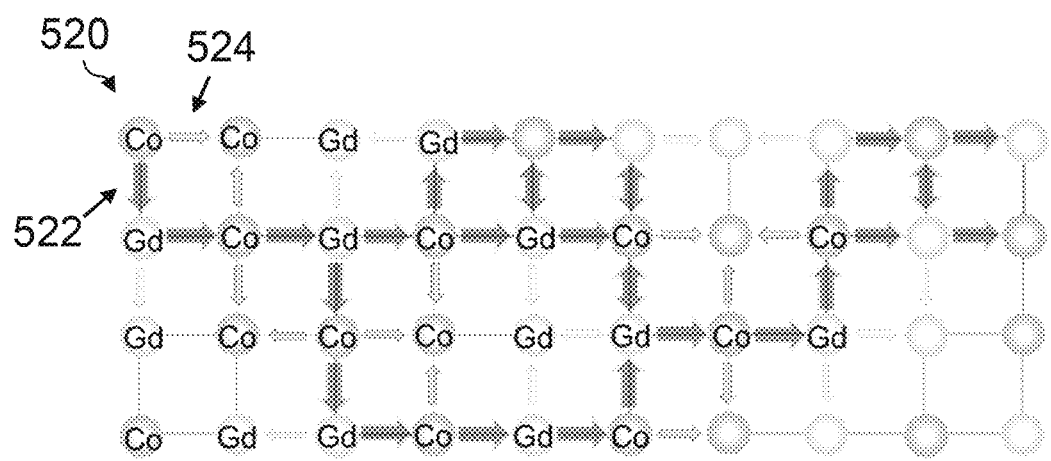

FIGS. 5A, 5B and 5C show schematic diagrams illustrating angular momentum transfer in a ferrimagnetic alloy CoGd for explaining the ultrafast switching and domain wall velocity observed in compensated ferrimagnet such as the ferrimagnetic alloy CoGd used in the SOT device 100 of FIG. 1.

The ultrafast switching and domain wall velocity observed in ferrimagnets can be understood by the transfer of spin angular momentum between rare-earth-transition-metal (RE-TM) sublattices. In particular, previously reported time-resolved X-ray magnetic circular dichroism (XMCD) measurements had demonstrated the ultrafast angular momentum transfer between antiferromagnetically exchange-coupling sublattices. For example, in CoTb alloy, a characteristic time of angular momentum transfer is 140±60 fs, corresponding to the timescale of the exchange interaction. The transfer rate of antiferromagnetically coupling link is ~5 times larger than that of the ferromagnetically coupling link.

FIG. 5A shows a schematic diagram 500 of atomic distribution in the ferrimagnetic alloy CoGd. The CoGd alloy displays nanoscale chemical and magnetic inhomogeneities with different Co and Gd concentrations. This is shown in FIG. 5A where the ferromagnetic alloy CoGd comprises Co-rich region 502 and Gd-rich region 504.

FIG. 5B shows a schematic diagram 510 illustrating exchange coupling in the ferrimagnetic alloy CoGd. As shown in FIG. 5B, angular momentum can be transferred between the Co-rich region 502 and the Gd-rich region 504 via ferromagnetic coupling 512 and antiferromagnetic coupling 514. The ferromagnetic coupling 512 is provided between like atoms such as a Co—Co ferromagnetic link and the antiferromagnetic coupling 514 is provided between dissimilar atoms such as a Co—Gd antiferromagnetic link as shown in FIG. 5B. The local angular momentum transfer between antiferromagnetically coupled sublattices is more energy efficient, in which the transfer rate is ~5 times higher than that of ferromagnetically coupled link. As a consequence, Gd atoms that bridge the Co atoms, and vice versa, forming the antiferromagnetic links, accelerate the transfer of angular momentum through the whole CoGd system, resulting in a fast collective behavior (e.g. magnetization switching/domain wall (DW) motion) in the CoGd system. This is for example illustrated in FIG. 5C.

FIG. 5C shows a schematic diagram 520 of spin angular momentum transfers through anti-ferromagnetic coupling in the ferrimagnetic alloy CoGd of FIG. 5A. As illustrated in FIG. 5C, with a random distribution of atoms/sublattices, the angular momentum transfer will quickly proceed through the Co—Gd antiferromagnetically-linked chains in a compensated sample, forming a trajectory exemplified by thicker arrows 522. Given that the local angular momentum transfer between antiferromagnetically coupled sublattices is faster than ferromagnetically coupled sublattices, the trajectory as shown by the thicker arrows 522 promotes a faster DW motion and switching than the thinner arrows 524 related to the ferromagnetically-coupled links between the Co—Co atoms.

Figure 6:
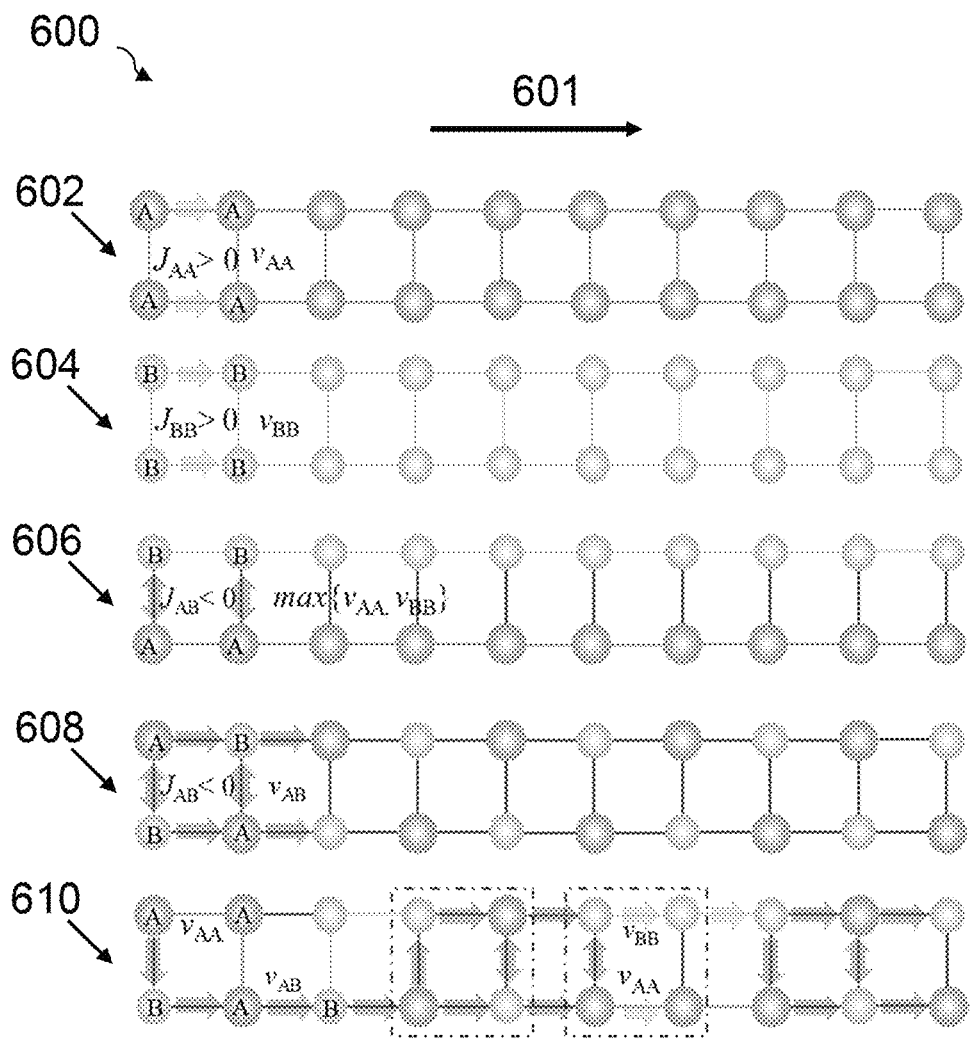
FIG. 6 shows schematic diagrams for illustrating domain wall propagation for different magnetic systems in accordance with an embodiment.

For a sample having a composition away from the compensation point, switching through the antiferromagnetically-linked chains will be interrupted by the presence of ferromagnetically-linked chains, thereby slowing down the switching process. This behavior is qualitatively verified using a two-dimensional (sing model, which confirms the role of the antiferromagnetic coupling links in accelerating the switching process in ferrimagnets. This is illustrated in FIG. 6 below. Therefore, by using a compensated ferrimagnetic alloy CoGd in the SOT device 100, the switching speed and energy-efficiency are significantly and simultaneously improved due to the antiferromagnetic exchange coupling.

FIG. 6 shows schematic diagrams 600 for illustrating domain wall propagation in magnetic systems. In FIG. 6, simplified cases with two atomic chains in an ordered magnetic system are considered. The propagation direction is shown by the arrow 601.

The magnetic systems 602, 604 show a scenario where the magnetic system consists of only one type of atom (A or B), such as in a pure ferromagnetic system. As shown in FIG. 6, the pure ferromagnetic system 602 consists of only atom A and the pure ferromagnetic system 604 consists of only atom B. In the pure ferromagnetic systems 602 and 604 as shown in FIG. 6, the domain wall propagates at a velocity of $v_{AA}$ and $v_{BB}$, respectively. The pure ferromagnetic systems 602 and 604 also have a positive exchange constant $J_{AA}$ and $J_{BB}$, respectively.

The systems 606, 608 consist of the same composition of $A_{50}B_{50}$. The system 606 shows two atomic chains with three kinds of links (A-A, B-B, and A-B links), with ferromagnetic coupling within each chain but antiferromagnetic coupling (A-B links) between the chains. Due to the antiferromagnetic coupling between the two atomic chains, the magnetization will reverse with a fast speed between A and B. However, the velocity is limited in the propagation direction 601 by the ferromagnetic links. In other words, the domain wall in the system 606 still propagates at a maximum velocity of either $v_{AA}$ or $v_{BB}$. In the system 608, the atoms are alternately arranged with only antiferromagnetic A-B links, which is very similar to the configuration of an antiferromagnet. In this case, a fast switching can happen due to a high domain wall velocity $v_{AB}$. In reality, an alloy is comprised of randomly distributed atoms, as shown in the system 610. Taking advantage of a strong antiferromagnetic couplings between A and B, a relative fast switching can be realized in a ferrimagnet, such as CoGd.

Figure 7:
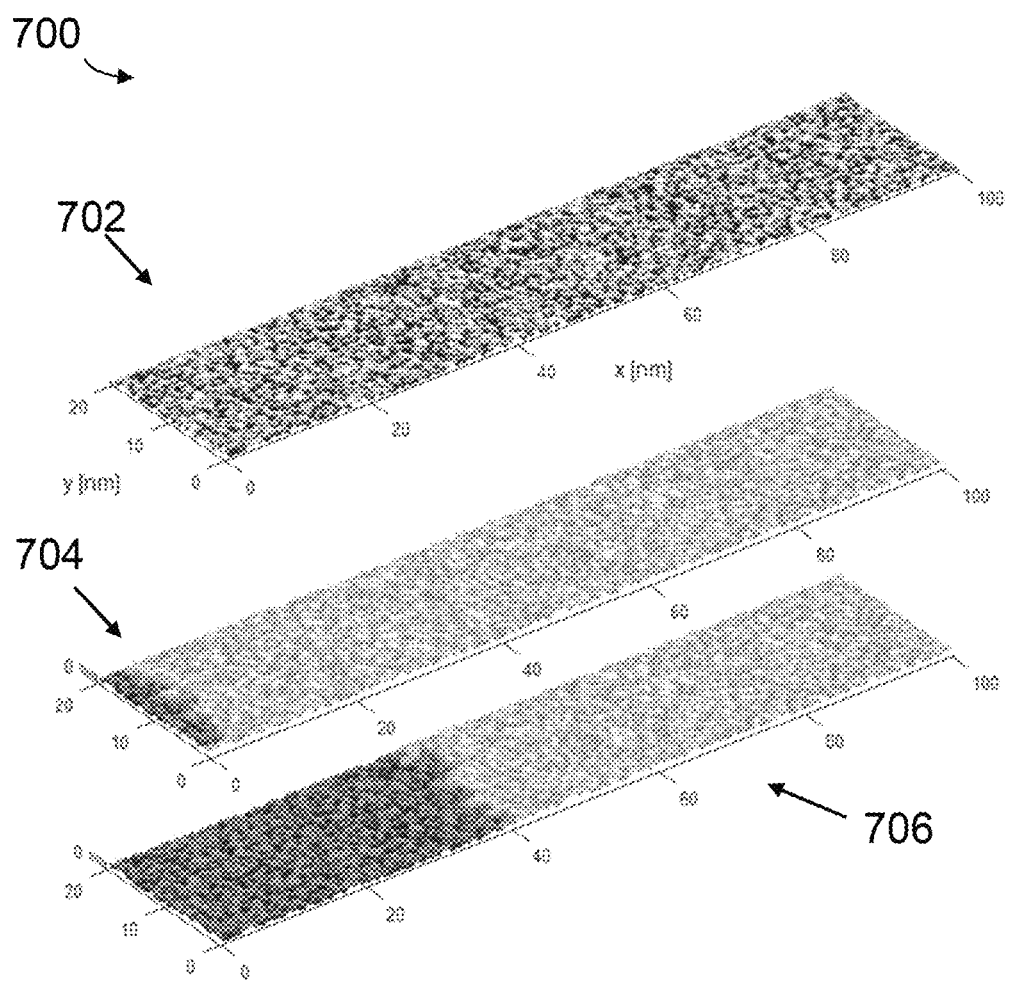
FIG. 7 shows schematic diagrams for illustrating simulation results of domain wall propagation in a magnetic system comprising a ferrimagnetic alloy $A_{50}B_{50}$ in accordance with an embodiment.

FIG. 7 shows schematic diagrams 700 for illustrating simulation results of domain wall propagation in a ferrimagnetic alloy system comprising $A_{50}B_{50}$, similar to the system 610 as shown in FIG. 6. The darker atoms represent the A atoms and the lighter atoms represent the B atoms.

The dynamics of domain wall motion in a ferrimagnetic alloy system 702 of FIG. 7 are analysed using the two-dimensional Ising model. For simplicity, a constant exchange value of J for each atomic arrangement ($J_{AA}$, $J_{BB}$>0 and $J_{AB}$<0) was assumed. The simulation was performed over a strip/wire with the dimensions 100 nm×20 nm in the x-y plane, with a distance of 0.4 nm between each atom. The magnetization was fully initialized with the magnetization of the A atoms, $m_A$, along the +z direction and the magnetization of the B atoms, $m_B$, along the z direction. The z-direction is defined as a direction perpendicular to the x-y plane. In the system 704, the domain nucleates at the left side. Due to the fast transfer of spin angular momentum between antiferromagnetically coupled A and B atoms, the magnetization switching first propagates along the A-B links, and then expands to the neighbouring atoms through ferromagnetic links. As the antiferromagnetic coupling links is 10 times faster than that of ferromagnetic links, the total propagation speed is mainly determined by the antiferromagnetic coupling links. The system 706 shows the expansion of the magnetic domain on the left side of the system 704 towards the right side.

To further understand the fast domain wall (DW) motion and the SOT switching in ferrimagnet, atomistic spin model simulations were performed. The SOT driven DW motion in ferrimagnets is modeled using a one-dimensional atomistic model. A Néel-type DW configuration was initialized with antiferromagnetically coupled transition metal (TM) and rare-earth (RE) elements. Spin dynamics is described by the atomistic Landau-Lifshitz-Gilbert (LLG) equation, which was solved using the Runge-Kutta fourth-order method. These steps are outlined below.

The spinorbit torque driven domain wall motion in ferrimagnets is modelled using a one-dimensional atomistic model, which includes simplified antiferromagnetic coupled elements separated at a lattice constant d=0.4 nm (for example as shown in the system 608 of FIG. 6). The Hamiltonian is given by:

$$H = -A \sum_i S_i \cdot S_{i+1} - K_i \sum_i (S_i \cdot \hat{z})^2 + \qquad (1)$$
$$K_i \sum_i (S_i \cdot \hat{x})^2 + D_{DMI} \sum_i \hat{y} \cdot (S_i \times S_{i+1}),$$

where $S_i$ is the lattice-site spin moment normalized to unity, A is the exchange constant, $K_i$ is the easy-axis anisotropy. $K_i$ is the domain wall hard-axis anisotropy, and $D_{DMI}$ is the Dzyaloshinskii-Moriya interaction (DMI) constant.

The spin dynamics of each sublattice is described by the atomistic LLG equation:

$$\partial S_i/\partial t = -\gamma_i S_i \times B_{eff,i} + \alpha_i S_i \times \partial S_i/\partial t - \gamma_i \hbar J_C \theta_{SH}/(2eM_{S,i}t_z) S_i \times (S_i \times \hat{y}), \qquad (2)$$

where $\alpha_i$ is the damping constant, $\hbar$ is reduced Plank's constant, $J_C$ is the charge current density, $\theta_{SH}$ is the spin-Hall angle, e is the electron charge, $M_{S,i}$ is the saturation magnetization, $t_z$ is the thickness of the ferrimagnetic layer, $\gamma_i$ is the gyromagnetic ratio and $B_{eff,i}$ is the effect field.

The three terms on the right-hand side are precession, damping, and spin-orbit torque term, respectively. The parameters used in the simulation are summarized as follows: A=−15 meV, $K_{TM}=K_{RE}=0.08$ meV, $K_{TM}=K_{RE}=0.08$ μeV, $D_{DMI}=0.128$ meV, $\alpha_{TM}=\alpha_{RE}=0.02$, $f_z=0.4$ nm, $g_{TM}=2.2$, $g_{TM}=2$, $\theta_{SH}=0.2$, $M_{S,TM}=7.0 \times 10^5$ A m$^{-1}$, and $M_{S,RE}=6.36 \times 10^5$ A m$^{-1}$. The atomistic LLG equations were solved using the Runge-Kutta fourth-order method with a time step of 2 fs.

Figure 8A:
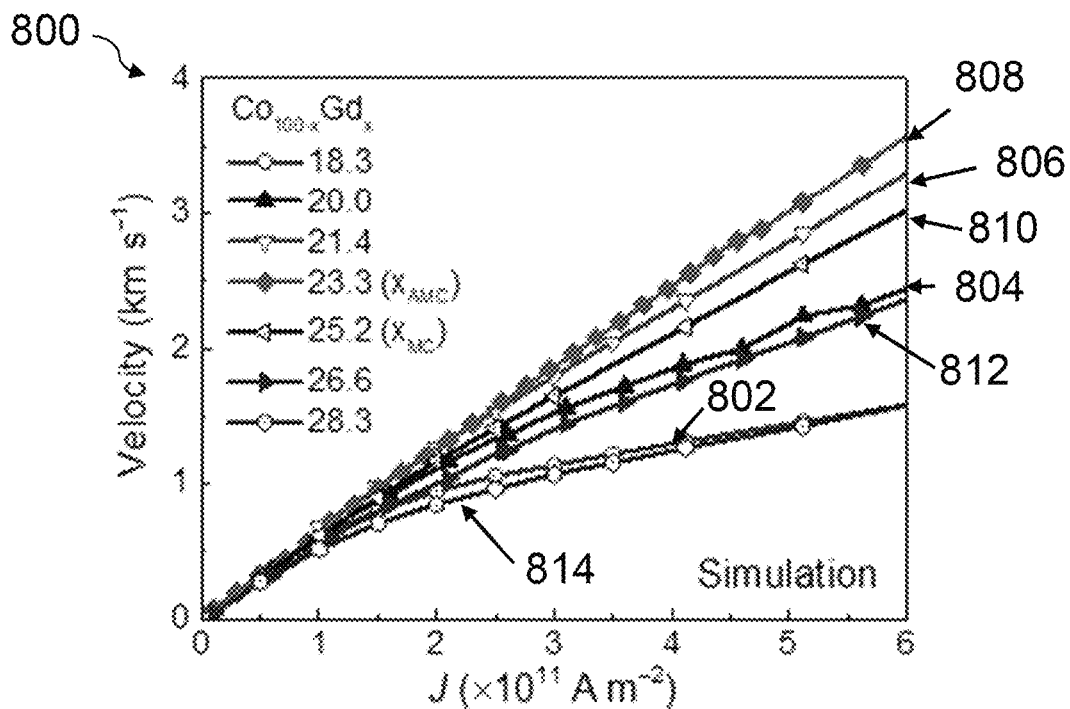
FIGS. 8A and 8B show plots of calculated domain wall velocity in the ferrimagnetic alloy CoGd of FIG. 5A in accordance with an embodiment, where

To study the effect of net angular momentum $\delta s = |s_{TM} - S_{RE}| = |M_{TM}/\gamma_{TM} - M_{RE}/\gamma_{RE}|$ on the domain wall velocity, numerical simulations with different $\delta s$ were performed, where $\gamma_{TM(RE)}$ is the gyromagnetic ratio of TM(RE) element. With a non-zero $\delta s$, the domain wall velocity increases but saturates, whereas it shows a linear increase for $\delta s=0$ (x~23.3). This is shown in FIG. 8A. These results agree with the theoretical prediction of domain wall motion in ferrimagnets, which explains the linear relation at $\delta s=0$, corresponding to a composition of $Co_{76.7}Gd_{23.3}$, due to the decoupling of domain wall position and angle. Note that $\delta s$ can be tuned by controlling the composition and temperature in a ferrimagnet.

The domain wall velocities between a ferromagnet and ferrimagnet were compared by choosing $A_{FM}=15$ meV. The calculated results of domain wall velocity in the ferrimagnet are about one or two orders of magnitude larger than that of the ferromagnet. Since most parameters between the ferromagnet and ferrimagnet are kept as the same only except the sign of exchange constant A, the enhanced domain wall velocity is attributed to the antiferromagnetic exchange coupling between the ferrimagnet atoms.

Simulations using the one-dimensional spin model based on the atomistic Landau-Lifshitz-Gilbert (LLG) equation as described above were performed for different ferrimagnetic compositions of the CoGd alloy.

FIG. 8A shows a graph 800 of the calculated DW velocity for various ferrimagnetic alloy $Co_{100-x}Gd_x$ compositions as a function of the current density, without considering pinning. The various CoGd compositions simulated are x=18.3, 20.0, 21.4, 23.3, 25.2, 26.6, and 28.3. The simulated plots for x=18.3 is 802, for x=20.0 is 804, for x=21.4 is 806, for x=23.3 is 808, for x=25.2 is 810, for x=26.6 is 812, and for x=28.3 is 814 as shown in FIG. 8A. While the DW velocity for uncompensated samples (e.g. as shown by plots 802 and 814) shows a tendency to saturate with increasing current density due to a change in the DW propagation mode, the DW velocity keeps increasing for the compensated samples (e.g. as shown by plot 808).

Figure 8B:
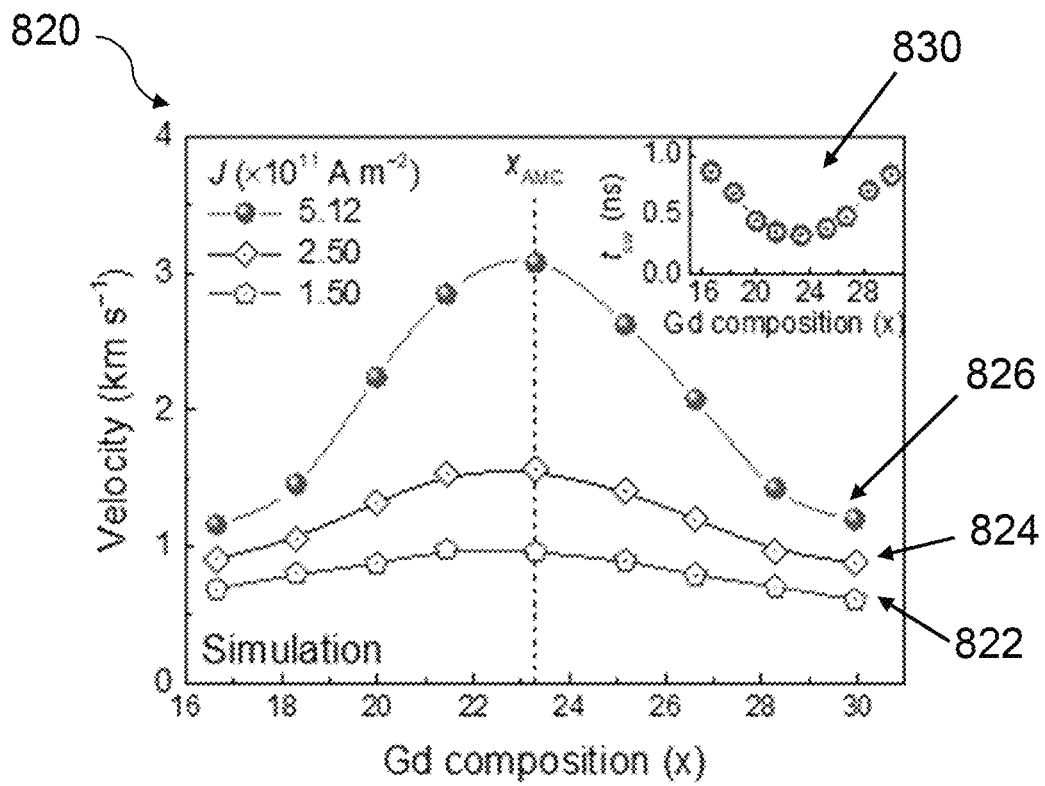

FIG. 8B shows a plot 820 of calculated domain wall velocity as a function of Gd composition for different current densities. The various current densities used are J=1.50× $10^{11}$ A m$^{-2}$, J=2.5×$10^{11}$ A m$^{-2}$, and J=5.12×$10^{11}$ A m$^{-2}$, which are represented by the plots 822, 824 and 826, respectively. As shown in FIG. 8B, the DW velocity reaches its peaks at the angular momentum compensated composition $x_{AMC}$, with x=23.3. For $X_{AMC}$, fast domain wall motion with J=5.12×$10^{11}$ A m$^{-2}$ would result in a switching time of 0.35 ns in a 1000-nm-wide sample. This is shown in the inset 830 of FIG. 8B. This calculated switching time is comparable to the experimental values as will be discussed below in relation to FIG. 160.

Experimental results to demonstrate ultrafast SOT switching in the ferrimagnetic alloy CoGd are discussed below in relation to FIGS. 9A to 21D. To perform the experiments, film stacks of Pt (8 nm)/$Co_{100-x}Gd_x$ (5 nm)/TaO$_x$ (1 nm)/SiO$_2$ (4 nm) were deposited on Si/SiO$_2$ substrates using magnetron sputtering with a base pressure of less than 5×$10^{-9}$ Torr at room temperature. The CoGd alloy layers were deposited by co-sputtering Co and Gd targets. The sputtering power of Co target was fixed at 120 W while varying the sputtering power of Gd target from 60 to 120 W. The Co and Gd compositions were confirmed in the range from $Co_{83}Gd_{17}$ to $Co_{64}Gd_{36}$ by Rutherford backscattering spectrometry.

Figure 9A:
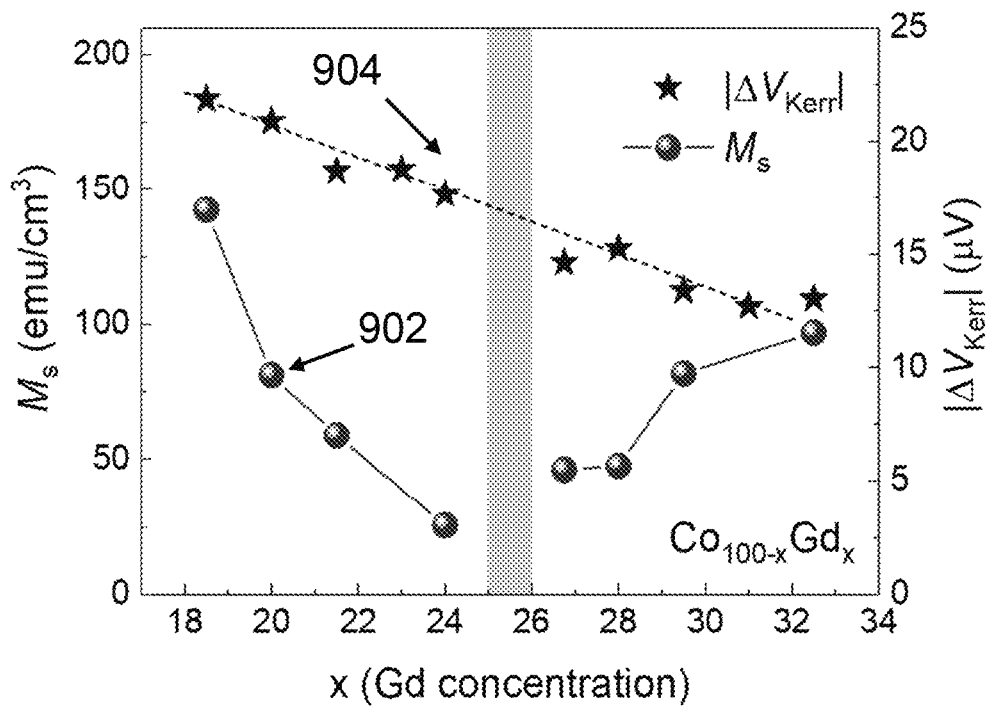
FIGS. 9A and 9B show plots of magnetization of ferrimagnetic CoGd films having different compositions in accordance with an embodiment, where
Figure 9B:
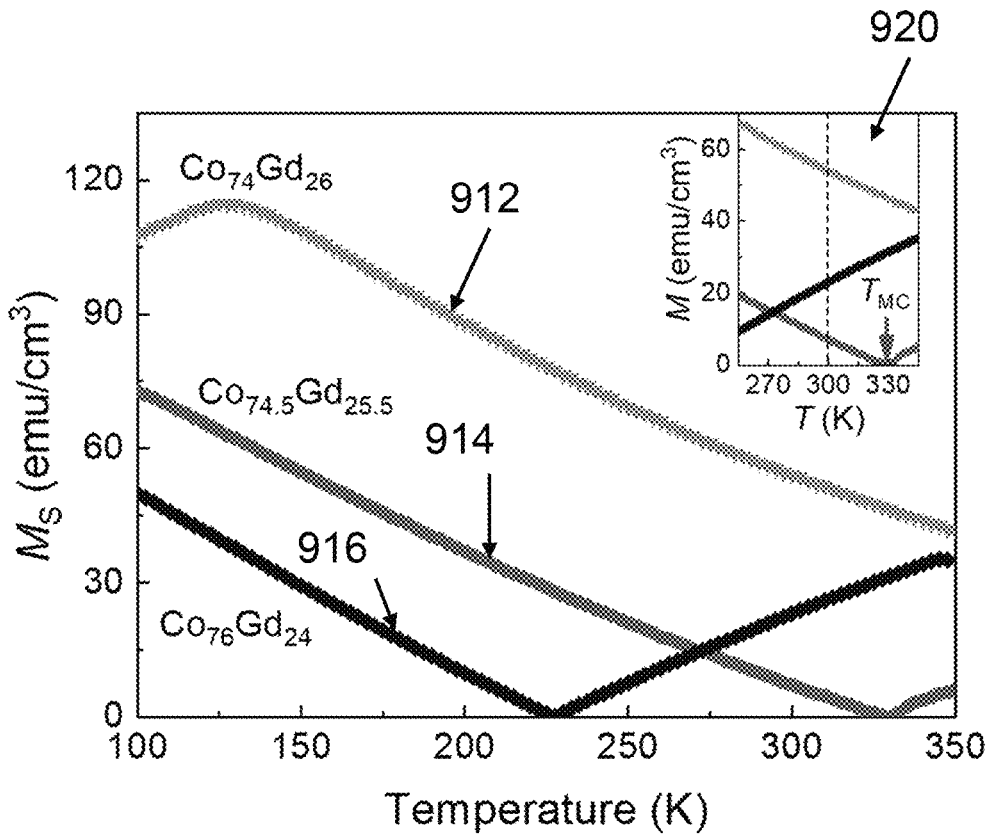

FIGS. 9A and 9B show plots of saturation magnetization of ferrimagnetic CoGd films having different Gd concentrations. These plots are used to characterize the magnetic properties of $Co_{100-x}Gd_x$ and can be used to identify the magnetization compensation of the $Co_{100-x}Gd_x$ alloy. The data from these plots were collected by measuring a series of Pt (8 nm)/$Co_{100-x}Gd_x$(5 nm)/TaO$_x$ (1 nm)/SiO$_2$ (4 nm) films prepared as described above.

These magnetic films exhibit bulk perpendicular magnetic anisotropy. The hysteresis loops were measured by polar magneto-optic Kerr effect (MOKE) and vibrating sample magnetometer (VSM). The divergence of $H_c$ indicates the magnetization compensation ($x_{MC}$).

FIG. 9A shows a plot 902 of saturation magnetization of the ferrimagnetic films of different CoGd compositions, and a plot 904 of the corresponding Kerr signal change as a function of Gd concentration. As shown by the plot 902 of FIG. 9A, the net magnetization $M_s$ shows a minimum value around the magnetization compensation. Since the Kerr signal is mainly dominated by the Co sublattices, the absolute value of the change of Kerr signal, $|\Delta V_{Kerr}|$, between the "up" and "down" states gradually decreases with increasing the Gd concentration as shown by the plot 904 of FIG. 9A, which confirms the gradual change in the Co composition.

To accurately characterize the magnetic properties of $Co_{100-x}Gd_x$ in the vicinity of the $x_{MC}$, the temperature dependence of the magnetization M(T) is measured using superconducting quantum interference device (SQUID).

FIG. 9B shows plots 912, 914, 916 of magnetization of the ferrimagnetic CoGd films having different Gd concentrations as a function of temperature. These plots were measured in an external magnetic field H=2000 Oe under field cooling conditions using the SQUID. The different CoGd compositions used are $Co_{74}Gd_{26}$, $Co_{74.5}Gd_{25.5}$, and $Co_{76}Gd_{24}$, as represented by the plots 912, 914 and 916, respectively. The inset 920 of FIG. 9B shows an enlarged plot area around the magnetization compensation point for the plots 912, 914, 916. As shown in FIG. 9B, the M(T) curve 914 of $Co_{74.5}Gd_{25.5}$ shows a distinct transition from Gd-rich to Co-rich with the magnetization compensation temperature $T_{MC}$~330 K. At room temperature ($T_{RM}$~300 K), the $M_s$ of $Co_{74.5}Gd_{25.5}$ measured was ~7.1 emu cm$^{-3}$, which is slightly Gd-rich and is very close to the magnetization compensation state. In addition, the $Co_{75}Gd_{25}$ film shows a Co-rich at room temperature. Thus, the compensation composition $x_{MC}$ should be between 25 and 25.5.

Although $x_{MC}$ and $T_{MC}$ can be determined by MOKE and VSM measurements as described in relation to FIGS. 9A and 9B above, the $T_{AMC}$ is not easy to be determined. For CoGd ferrimagnets, the net magnetization $M_s$ and angular momentum $A_s$ are written as: $M_s=M_{Co}-M_{Gd}$ and $A_s=A_{Co}-A_{Gd}=M_{Co}/\gamma_{Co}-M_{Gd}/\gamma_{Gd}$, where $M_{Co}$ and $A_{Co}$ are the magnetic moment and angular momentum of the Co sublattices, respectively, and $M_{Gd}$ and $A_{Gd}$ are the magnetic moment and angular momentum of the Gd sublattices, respectively. The gyromagnetic ratio of Co ($\gamma_{Co}$) is slight larger than that of Gd ($\gamma_{Gd}$). Thus, the $T_{AMC}$ is expected to be higher than $T_{MC}$ ($T_{AMC}>T_{MC}$) in CoGd.

To identify the angular momentum compensation point ($x_{AMC}$) at the room temperature, a theoretical model based on the modified Landau-Lifshitz-Bloch (LLB) equation was used:

$$\frac{dm_v}{dt} = \gamma_v(m_v \times H_v^{MFA}) - \Gamma_{v,\square}\left(1 - \frac{m_v \cdot m_{0,v}}{m_v^2}\right)m_v - \Gamma_{v,\perp}\left(1 - \frac{m_v \times (m_v \times m_{0,v})}{m_v^2}\right), \quad (3)$$

where $m_v$ is the sublattice magnetization (v denotes either TM or RE element), $m_{0,v}$ is the equilibrium magnetization, $\gamma_v$ is the gyromagnetic constant, $H_v^{MFA}$ is the mean field with considering the exchange coupling, and $\Gamma_{v,\square}$ and $\Gamma_{v,\perp}$ are the longitudinal and transverse damping coefficients, respectively. On the right side of Equation (3) above, the first term describes the precession of magnetization, the second and the last terms introduce the longitudinal and transverse relaxation. Thus, the LLB model enables the systematic descriptions of the magnetization and angular momentum in ferrimagnets when the composition or temperature changes.

Based on the experimental results, the magnetization compensation point of the CoGd films is expected at $x_{MC}$~25.2 at room temperature (i.e. T=300 K). The LLB model was calibrated by matching the numerically obtained value with the experimental one $x_{MC}$~25.2. The key parameter of the exchange interaction $J_{RE-TM}$ between RE and TM was calibrated. Combined with the previously reported Landé g factors of Co (~2.2) and Gd (~2) atoms, the net magnetization ($M_s$) and angular momentum compensation ($A_s$) as a function of concentration of Gd and temperature can be estimated using the LLB model.

Figure 10A:
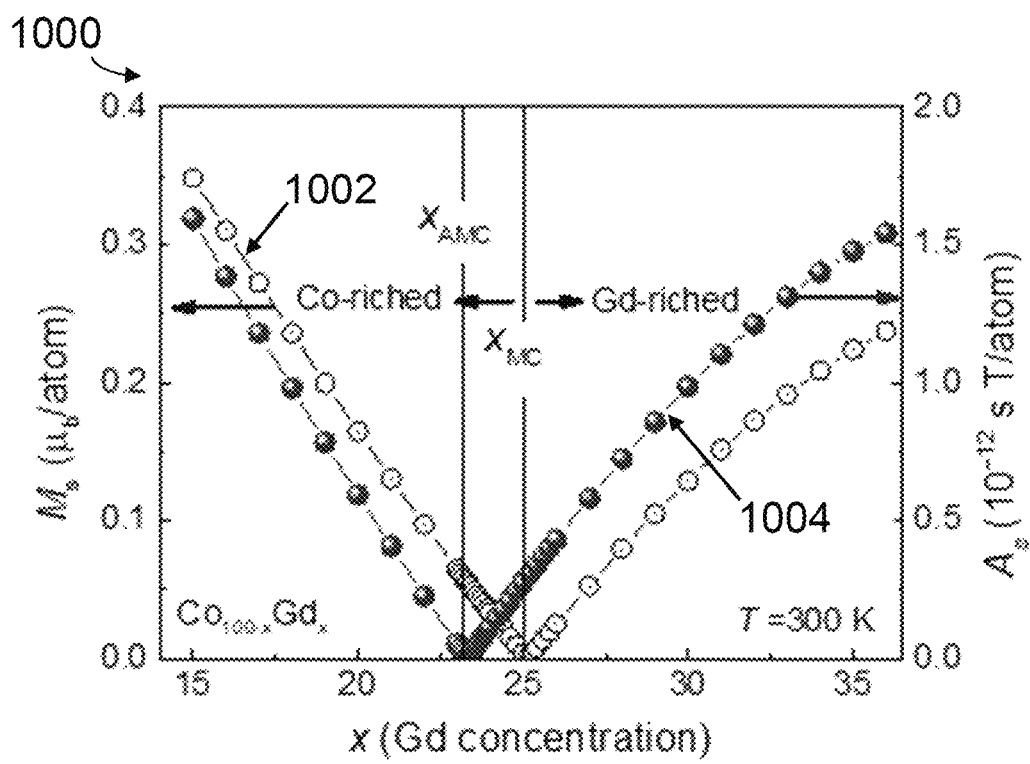
FIGS. 10A and 10B show plots of calculated net magnetization $M_S$ and net angular momentum $A_S$ of the CoGd ferrimagnetic alloy in accordance with an embodiment, where
Figure 10B:
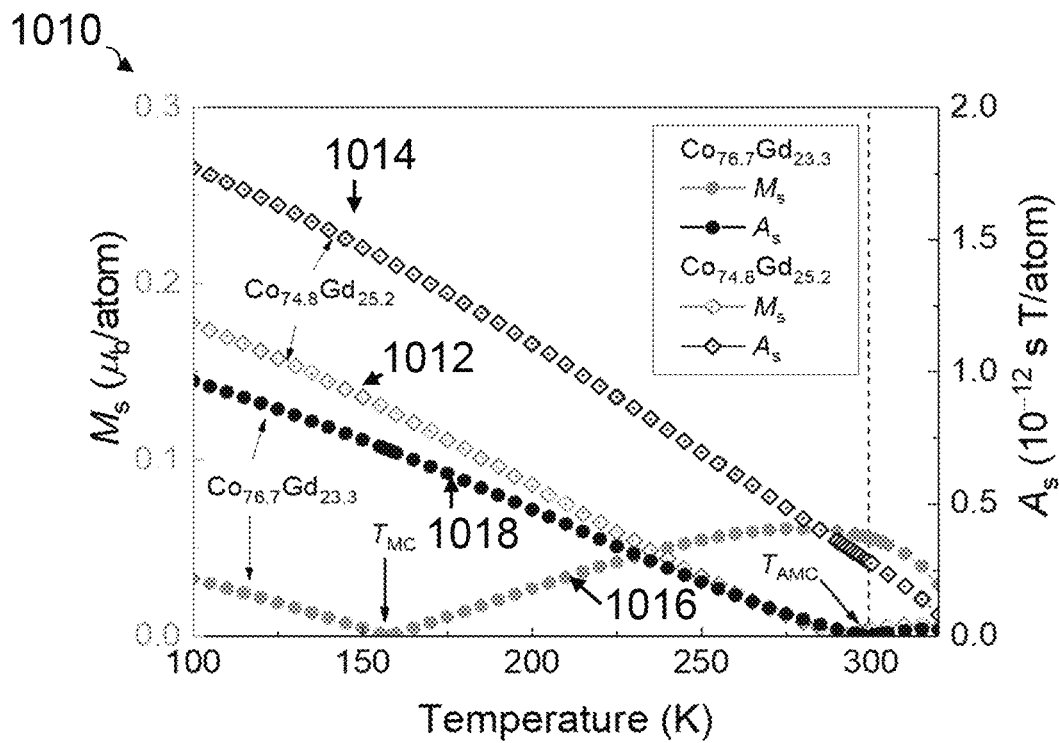

FIGS. 10A and 10B show plots of calculated net magnetization $M_S$ and net angular momentum $A_S$ using the above LLB model.

FIG. 10A shows plots 1000 of calculated net magnetization $M_S$ and net angular momentum $A_S$ for CoGd films as a function of Gd concentration (x) at room temperature T=300 K. The calculated net magnetization $M_S$ is represented by the plot 1002, and the calculated net angular momentum $A_S$ is represented by the plot 1004. The calculated results as shown in FIG. 10A show that $Co_{74.8}Gd_{25.2}$ (x≈25.2) is the magnetization compensated composition and $Co_{76.7}Gd_{23.3}$ (x≈23.3) is the angular momentum compensated composition.

FIG. 10B shows plots 1010 of net magnetization $M_S$ and net angular momentum $A_S$ for CoGd films as a function of temperature for two different CoGd compositions of $Co_{74.8}Gd_{25.2}$ and $Co_{76.7}Gd_{23.3}$. The calculated net magnetization $M_S$ and calculated net angular momentum $A_S$ for $Co_{74.8}Gd_{25.2}$ are represented by the plots 1012 and 1014, respectively, while the calculated net magnetization $M_S$ and calculated net angular momentum $A_S$ for $Co_{76.7}Gd_{23.3}$ are represented by the plots 1016 and 1018, respectively. As shown in FIG. 10B, the calculated $T_{AMC}$ of $Co_{76.7}Gd_{23.3}$ is close to room temperature (i.e. close to T=300 K), at which it shows a Co-rich magnetization.

From the results of FIG. 10A, $x_{AMC}$~23.3 is extracted, and this is confirmed by $A_S(T)≈0$ at room temperature from the temperature dependence results of $Co_{76.7}Gd_{23.3}$ as shown in FIG. 10B.

To validate the above calculated results, a theoretical prediction based on temperature dependence of sublattice magnetization using a power-law relation was used. The power-law relation provides a linear relation between $T_{AMC}$ and $T_{MC}$ as $T_{AMC}=T_{MC}+\eta T_c$ in compensated ferrimagnets, where $\eta$ is the constant and $T_c$ is the Curie temperature. Using the magnetization results of $Co_{76}Gd_{24}$ as shown in FIG. 9B, $\eta$ and $T_c$ can be extracted as ~0.30 and 519.8 K, respectively. Therefore, the $T_{AMC}$ of $Co_{76}Gd_{24}$ is estimated as ~382.6 K. In addition, the $Co_{77.2}Gd_{22.8}$ is expected to be angular momentum compensated at room temperature, which is in good agreement with the results estimated by the LLB model. For the $Co_{76}Gd_{24}$ and $Co_{77}Gd_{23}$ films used in these experiments, they are therefore expected to have their $T_{AMC}$ around room temperature.

From the theoretical models and results as shown in relation to FIGS. 5A to 8B, a high SOT efficiency is expected to occur near the magnetization compensation point ($x_{MC}$), and a very high DW velocity for a ferrimagnet is expected at the angular momentum compensation point ($x_{AMC}$) with $A_S$=0. In order to investigate ferrimagnetic switching dynamics near compensation points ($x_{MC}$ and $x_{AMC}$), Pt (8 nm)/$Co_{100-x}Gd_x$ (5 nm) stacks were deposited on Si/SiO$_2$ substrates using magnetron sputtering as previously described, with a composition ranging from $Co_{83}Gd_{17}$ to $Co_{64}Gd_{36}$. For the static and time-resolved MOKE measurements, the films were patterned into microwires with a dimension of 3 μm×8 μm and with a coplanar waveguide for current pulse injections.

FIGS. 11A, 11B, 11C, 11D and 11E show diagrams in relation to time-resolved magneto-optical Kerr effect (MOKE) measurements of the ferrimagnetic alloy CoGd.

Figure 11A:
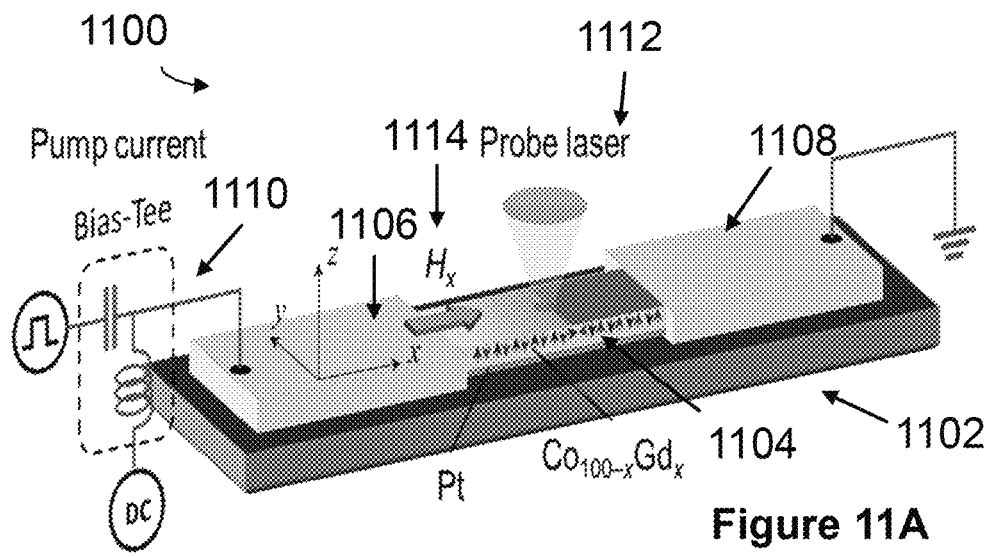
FIGS. 11A, 11B, 11C, 11D and 11E show diagrams in relation to time-resolved magneto-optical Kerr effect (MOKE) measurements of the ferrimagnetic alloy CoGd as shown in FIG. 5A in accordance with an embodiment, where

FIG. 11A shows a schematic diagram of the MOKE measurement setup 1100 for performing time-resolved polar magneto-optical Kerr effect (MOKE) measurements. A stroboscopic pump-probe technique is used to investigate the dynamics of current-induced magnetization switching. FIG. 11A shows a CoGd device 1102 used for the MOKE measurements. The CoGd device 1102 comprises a Pt/Co$_{100-x}$Gd$_x$ film 1104 formed between two electrodes 1106, 1108. The electrode 1106 is electrically connected to a pulse generator 1110 for receiving a pump current while the electrode 1108 is grounded. A picosecond probe laser 1112 is provided for the MOKE measurements. An external magnetic field H$_x$ 1114 is applied along the current direction for deterministic SOT switching in the Co$_{100-x}$Gd$_x$ film 1104. In these stroboscopic pump-probe experiments, the pulse generator 1110 (pump, Picosecond Pulse Labs 10060A) and the picosecond laser 1112 (probe, PiLas PiL040X) were synchronized by a pattern generator (Agilent 81134A) with a triggering frequency of 100 kHz. Approximately 2.4×10$^5$ reversal cycles were detected and averaged for each data point in the time-resolved MOKE to accumulate sufficient statistics. The probe laser 1112 with a center wavelength of 405 nm was polarized in a direction normal to the optical plane to detect an out-of-plane component of the magnetization, and was focused to an elliptical Gaussian spot of diameter D~2.86 µm, where a high (low) signal corresponds to the down (up) magnetic state of the Co sublattice. The time resolution in the time-resolved MOKE is ~50 ps. Static MOKE was also used to measure the current-induced magnetization switching and magnetic hysteresis loops.

Figure 11B:
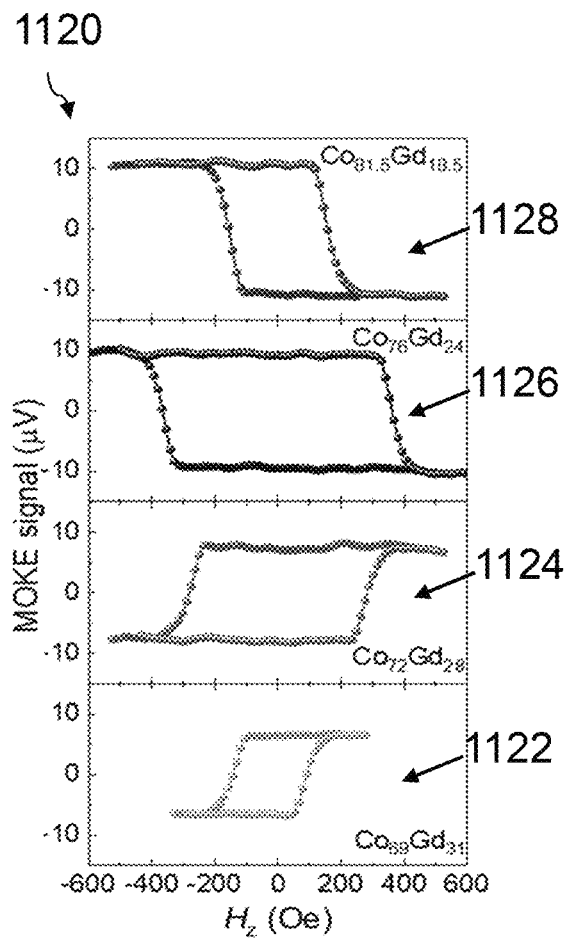

To characterize the magnetic properties of CoGd films, hysteresis loops were measured using MOKE at room temperature. FIG. 11B shows plots 1120 of static MOKE Kerr signal as a function of perpendicular magnetic field H$_z$ for Co$_{100-x}$Gd$_x$ films measured at room temperature. The hysteresis loop for Co$_{69}$Gd$_{31}$ is represented by the plot 1122, the hysteresis loop for Co$_{72}$Gd$_{28}$ is represented by the plot 1124, the hysteresis loop for Co$_{76}$Gd$_{24}$ is represented by the plot 1126, and the hysteresis loop for Co$_{81.5}$Gd$_{18.5}$ is represented by the plot 1128.

Figure 11C:
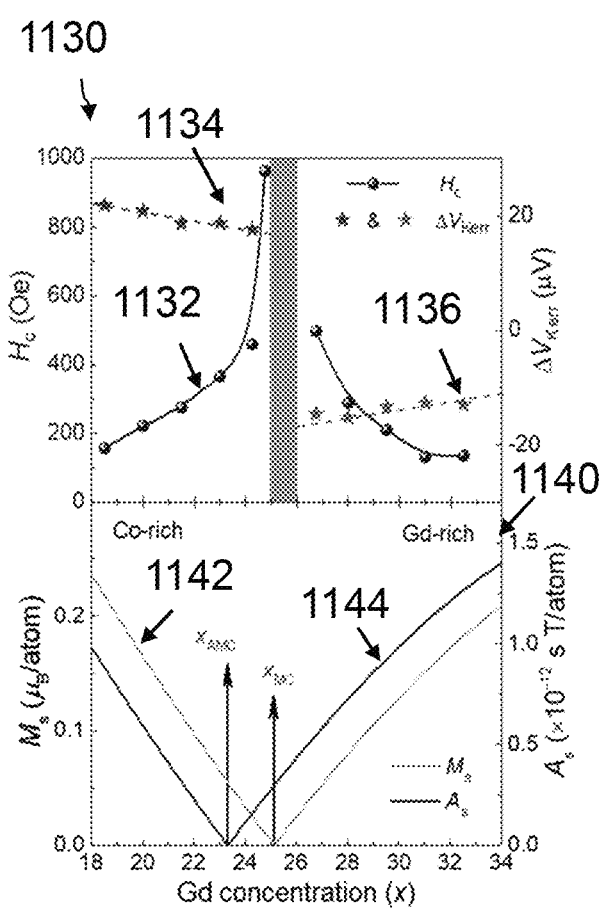

FIG. 11C shows plots 1130 of coercive field H$_c$ and the change of Kerr signal $\Delta V_{Kerr}$ as a function of Gd composition, and plots 1140 of net magnetization M$_S$ and net angular momentum A$_S$ as a function of Gd concentration (x) for the CoGd films at room temperature T=300 K. For the plots 1130, the coercive field, H$_c$, and the change of Kerr signal, $\Delta V_{Kerr}=V_{Kerr}(-H_z)-V_{Kerr}(+H_z)$, are extracted from the hysteresis loops of FIG. 11B. The coercive field, H$_c$, as a function of Gd composition is represented by the plot 1132, while the change of Kerr signal $\Delta V_{Kerr}$ is represented by the plots 1134 and 1136 where the plot 1134 represents a positive $\Delta V_{Kerr}$, and the plot 1136 represents a negative $\Delta V_{Kerr}$. As shown in FIG. 11C, H$_c$ increases when the Gd concentration (x) reaches ~25, and the polarity of the hysteresis loops reverses in sign across x~25. The divergence of H$_c$ and the sign change of $\Delta V_{Kerr}$ indicate a magnetization compensation point as x$_{MC}$~25.

In the bottom panel of FIG. 11C, the net magnetization M$_S$ and net angular momentum A$_S$ as a function of Gd concentration (x) are represented by the plots 1142 and 1144, respectively. These plots are calculated using the Landau-Lifshitz-Bloch model with the reported Landé g factors of Co (~2.2) and Gd (~2) atoms as described above. The estimated x$_{AMC}$ as read off from the plot 1144 is about 23.3.

Figure 11D:
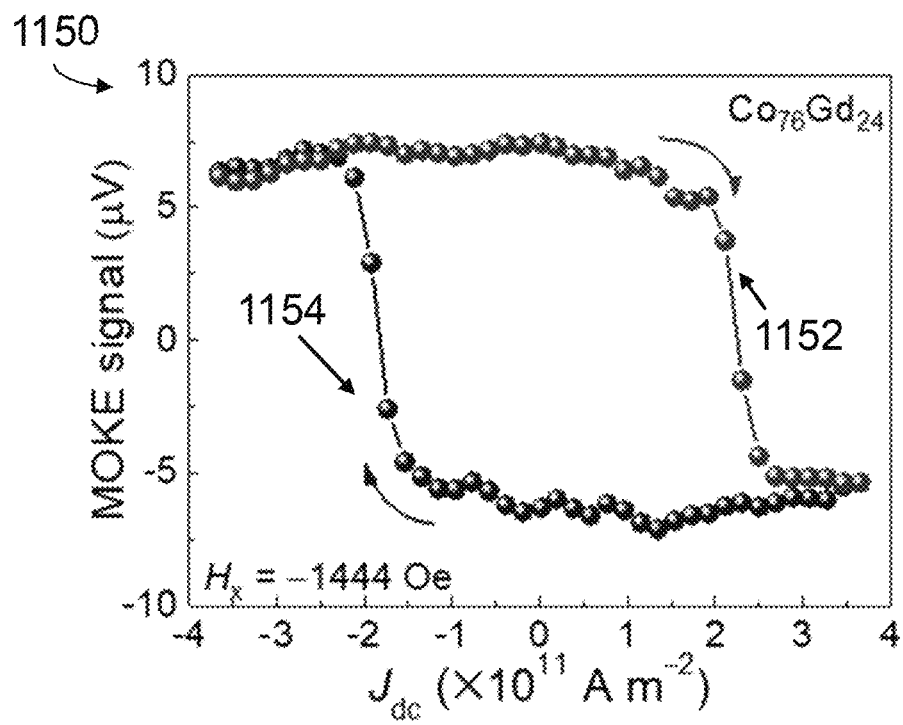

Static SOT switching measurements were performed on Co$_{76}$Gd$_{24}$ films, which are expected to have a composition close to x$_{AMC}$, at room temperature, FIG. 11D shows two plots 1152, 1154 of static MOKE Kerr signal as a function of d.c. current density to illustrate magnetization switching in these Co$_{76}$Gd$_{24}$ samples. The plot 1152 shows switching of the magnetization with a forward d.c. sweep while the plot 1154 shows a reverse switching of the magnetization with a reverse d.c. sweep. Deterministic magnetization switching can therefore be obtained using a d.c. current under an in-plane magnetic field H$_x$=−1444 Oe as shown in FIG. 11D.

Figure 11E:
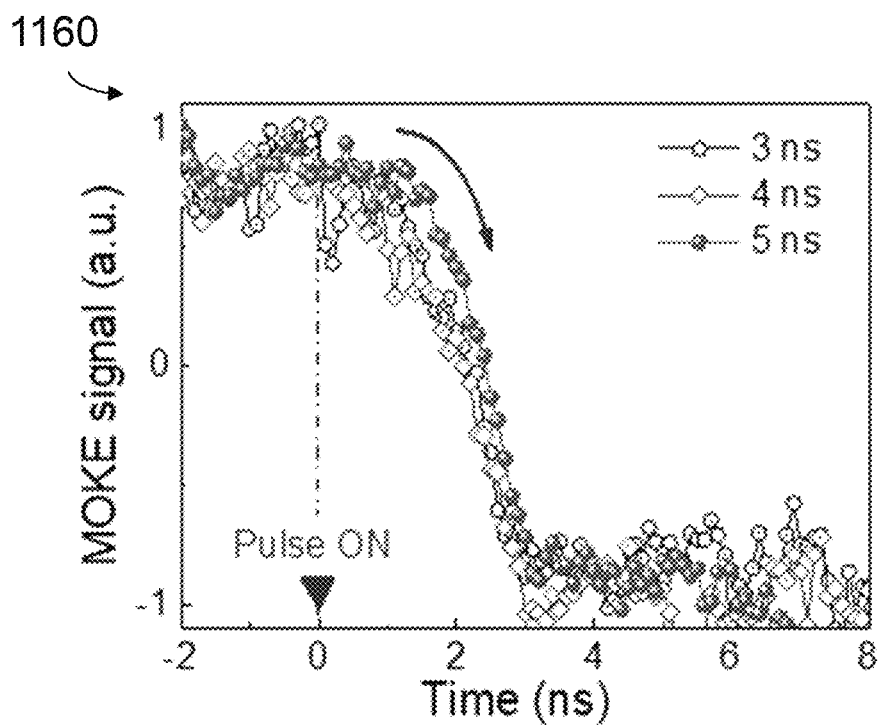

Time-resolved measurements were performed to evaluate SOT switching dynamics. FIG. 11E shows plots 1160 of temporal evolution of time-resolved Kerr signal for different pulse durations with a current density of J=4.2×10$^{11}$ A m$^{-2}$ and an external magnetic field H$_x$=−1444 Oe. Similar switching trajectories from the "down" to "up" magnetization state for different pulse durations (3, 4, and 5 ns) were observed, indicating a good repeatability of the magnetization switching phenomena.

Figure 12A:
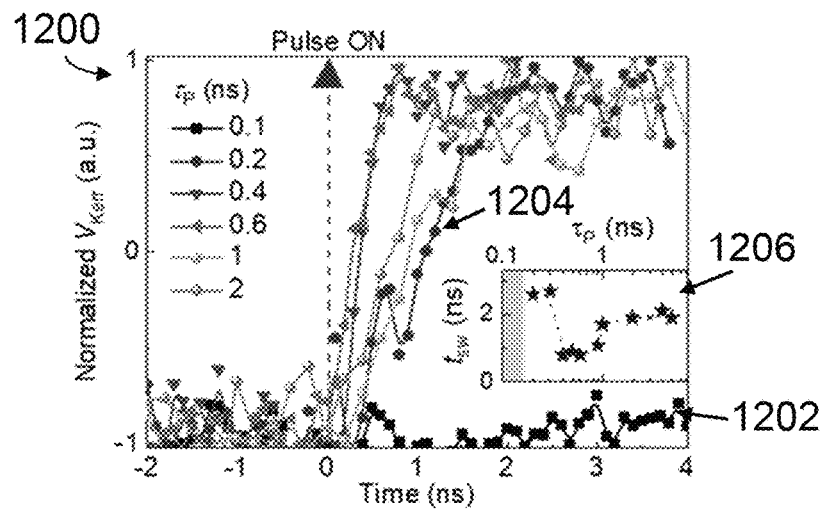
FIGS. 12A, 12B and 12C show plots in relation to magnetization switching in CoGd devices in accordance with an embodiment, where

FIG. 12A shows plots 1200 of temporal evolutions of MOKE signals for pulse durations $\tau_p$ ranging from 0.1 to 2 ns for Co$_{76}$Gd$_{24}$ with H$_x$=1444 Oe and J=4.2×10$^{11}$ A m$^{-2}$. The current pulses are injected at 0 ns on the time-axis (i.e. x-axis) of these plots 1200. The plot 1202 shows the MOKE signals for a pulse duration $\tau_p$ of 0.1 ns while the plot 1204 shows the MOKE signals for a pulse duration $\tau_p$ of 0.2 ns. From the plots 1202 and 1204, it can be concluded that the current-induced switching from the up to the down state can be achieved with current pulses as short as 0.2 ns. The switching by ultrashort current pulse in ferrimagnets was further confirmed by performing the switching probability measurements on a ferrimagnetic dot using an electrical technique. This is discussed in relation to FIGS. 18A to 18C below.

Figure 12B:
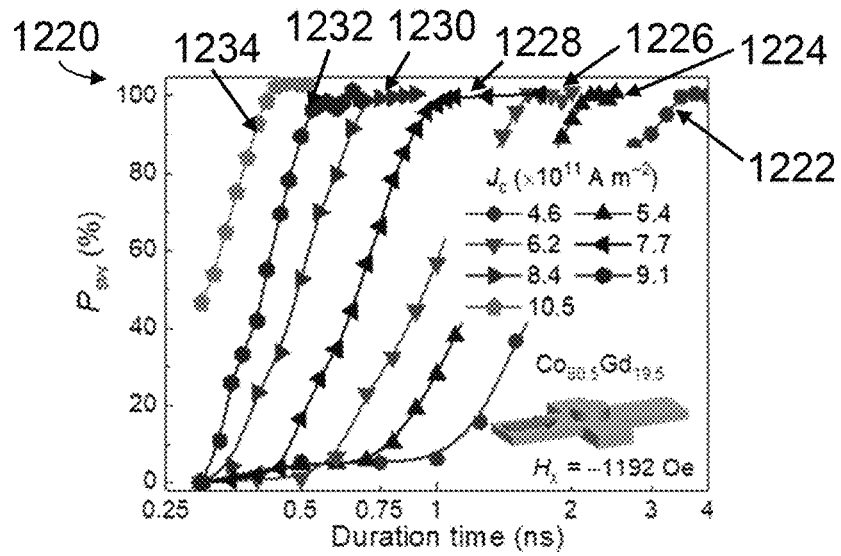

FIG. 12B shows plots 1220 of switching probability as a function of current pulse duration for different current densities for a Co$_{80.5}$Gd$_{19.5}$ device evaluated using anomalous Hall measurements. The measurements were performed in an external magnetic field H$_x$=−1192 Oe. The switching probability for current densities (i) J=4.6×10$^{11}$ A m$^{-2}$, (ii) J=5.4×10$^{11}$ A m$^{-2}$, (iii) J=6.2×10$^{11}$ A m$^{-2}$, (iv) J=7.7×10$^{11}$ A m$^{-2}$, (v) J=8.4×10$^{11}$ A m$^{-2}$, (iv) J=9.1×10$^{11}$ A m$^{-2}$, and (vii) J=1.05×10$^{12}$ A m$^{-2}$ are represented by the plots 1222, 1224, 1226, 1228, 1230, 1232 and 1234, respectively. As shown in FIG. 12B for the plot 1234, a pulse duration $\tau_p$~0.4 ns is required to achieve a switching probability of P$_{SW}$=90% for J=1.05×10$^{12}$ A m$^{-2}$.

TABLE 1

| Device Structure | Pulse duration | Current Density (A m$^{-2}$) | Magnetic field (mT) | Switching time (ns) | Size (nm) | Normalized switching time (100 nm) | Write energy per unit area (mJ cm$^{-2}$) |
|---|---|---|---|---|---|---|---|
| Pt(3 nm)/Co(0.6 nm)/AlO$_x$ | ~240 ps | 4.4 × 10$^{12}$ | 150 | ~1-1.4 | 90-100 | ~1 ns | 13.3 |
| Pt (5 nm)/Co (1 nm)/AlO$_x$ | 2 ns | 3.36 × 10$^{12}$ | 124 | 2 | 500 | 400 ps | 41.0 |
| Ta(3 nm)/Pt(8.5 nm)/Co (0.5 nm)/Al$_2$O$_3$ | 1 ns | 3.1 × 10$^{12}$ | 150 | 1.5 | 2000 | 75 ps | 6.30 |
| Pt(8 nm)/Co$_{76}$Gd$_{24}$ (5 nm) | 400 ps | 4.2 × 10$^{11}$ | 144.4 | 0.7 | 2800 | 25 ps | 0.174 |
| Ta(3 nm)/CoFeB(1.2 nm)/MgO | ~1.4 ns | 5.2 × 10$^{12}$ | 168 | 1.8 | 2000 | 90 ps | 15.0 |
| Ta(6 nm)/CoFeB(0.9 nm)/MgO | ~1 ns | 7.94 × 10$^{11}$ | 119.1 | ~2.2 | 1000 | ~220 ps | 4.10 |
| Ta(10 nm)/CoFeB (1 nm) | ~400 ps | 3.3 × 10$^{12}$ | 100 | ~0.9 | 150 | ~600 ps | 1867 |

In contrast, a ferromagnetic device of equivalent lateral dimension requires $\tau_p$>1.4 ns for switching under a similar current density and applied field. Although switching with sub-nanosecond pulse can be also achieved in ferromagnets, a very high pulse current density (3.0~4.4×10$^{12}$ A m$^{-2}$) is required. In comparison, SOT switching in ferrimagnets requires a current pulse of only moderate density (~4.2×10$^{11}$ A m$^{-2}$). Consequently, the switching energy consumption per unit area (E$_W$) of the present micron-sized ferrimagnet device is estimated to be ~86-217 µJ cm$^{-2}$, which is one to two orders of magnitude lower than that of ferromagnets. Table 1 above compares the performance parameters of ferromagnet and ferrimagnet SOT devices. The results for the compensated ferrimagnetic alloy Co$_{76}$Gd$_{24}$ of this disclosure are shown as bold in the Table 1 above.

The SOT switching process depends on the current density, external magnetic field, magnetic properties, and size of the device. Previous ferromagnet based SOT experiments showed that the gain in operation speed always comes at the expense of a rise in the current density. It is generally difficult to keep a fast operation and low energy consumption at the same time. Given that the speed of switching (or domain wall motion) is proportional to the current density and the switching time is proportional to the lateral size of the device, the device size is normalized, and each parameter is scaled for this comparison.

In addition, normalized write energy $E_{sw}=I^2R\tau_p$ is evaluated for three different SOT systems, where I is the switching current, R is the resistance of the channel, and $\tau_p$ is the pulse length.

Figure 13:
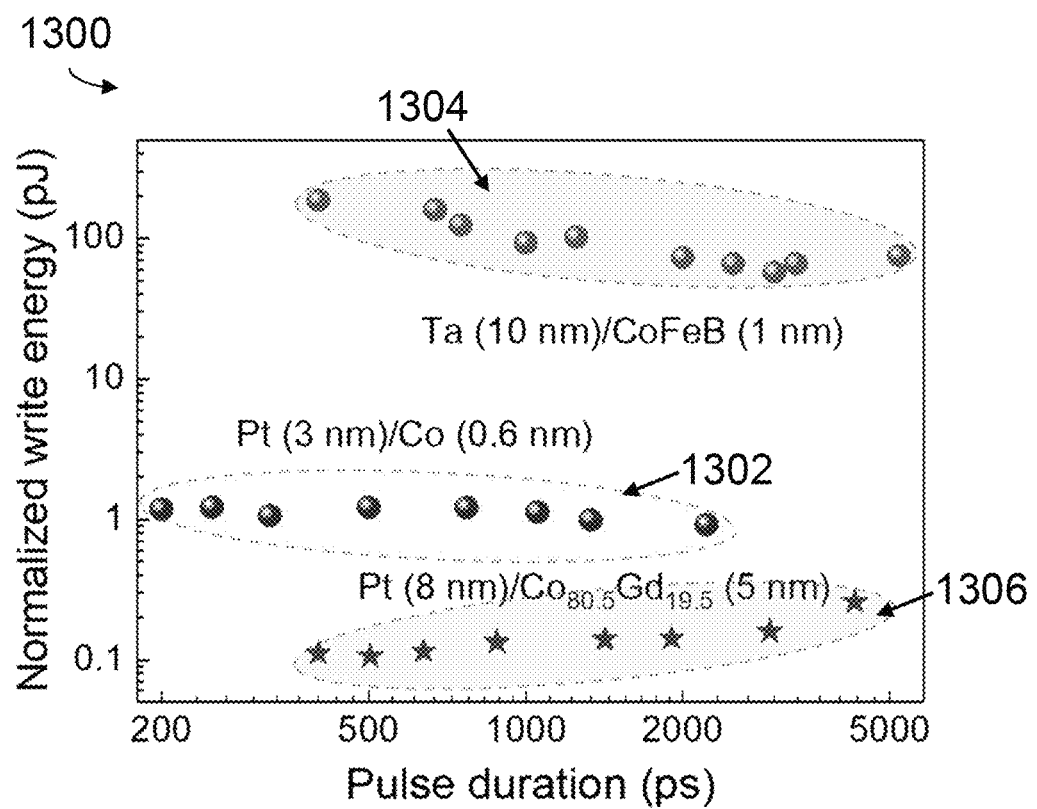
FIG. 13 shows a plot of normalized write energy consumption as a function of pulse duration for three different magnetic systems in accordance with an embodiment, namely Pt (3 nm)/Co (0.6 nm), Ta (10 nm)/CoFeB (1 nm), and Pt (8 nm)/$Co_{80.5}Gd_{19.5}$ (5 nm)

FIG. 13 shows a plot 1300 of the normalized write energy versus pulse duration for three different magnetic systems, namely Pt (3 nm)/Co (0.6 nm), Ta (10 nm)/CoFeB (1 nm), and Pt (8 nm)/Co$_{80.5}$Gd$_{19.5}$ (5 nm). Data points representing the magnetic systems of (i) Pt (3 nm)/Co (0.6 nm), (ii) Ta (10 nm)/CoFeB (1 nm), and (iii) Pt (8 nm)/Co$_{80.5}$Gd$_{19.5}$ (5 nm) are grouped under 1302, 1304 and 1306, respectively. For comparison, all the results were obtained from electrical measurements with similar conditions, and the lateral dimensions of devices were normalized to 100 nm. The energy consumption in the magnetic system Pt/Co$_{80.5}$Gd$_{19.5}$ of the present disclosure as shown by the data in the group 1306 is estimated to be ~0.11-0.26 pJ, which is about one to two orders of magnitude smaller than that of ferromagnets.

Further, the switching speed of the present Pt/CoGd device was examined. Although the Pt/CoGd device can be switched using a sub-nanosecond current pulse, the pulse duration does not necessarily correspond to the real switching time. Therefore, in order to evaluate the switching speed of the device, the temporal switching trajectories were investigated. Referring back to the inset 1206 of FIG. 12A, the switching time (t$_{SW}$) extracted from the temporal evolution of switching traces as a function of $\tau_p$ shows two distinct regimes, a short-duration intrinsic regime and long-duration thermal assisted regime. For an intermediate pulse duration $\tau_p$ of 0.4-0.6 ns, the Pt/CoGd device exhibits a fast switching behavior with t$_{SW}$~0.7 ns to switch an entire measured region having a diameter of 2.86 µm. Given that the SOT switching time is proportional to the lateral size of a device, t$_{SW}$<25 ps is expected for a 100-nm ferrimagnetic CoGd disc. The observed switching speed in a ferrimagnet is ~10 times faster compared to conventional ferromagnetic SOT devices (see e.g. Table 1 above). A minimum switching time of ~0.4 ns was reported for a 100-nm-wide ferromagnetic Pt/Co (1 nm) device. More importantly, a 10 times faster switching can be achieved in a substantially thick (5 nm) ferrimagnet using a quarter of the current density in a conventional ferromagnetic SOT device. The thermal stability factor, $\Delta=M_sH_kV/2k_BT$, for a 100 nm wide compensated ferrimagnetic disc of Co$_{76}$Gd$_{24}$ is estimated to be ~750, which is high enough to satisfy the industry requirement. Here, H$_k$, V, k$_B$ and T are the anisotropy field, the volume of the ferrimagnet, the Boltzmann constant, and the room temperature, respectively. This value of $\Delta$ is about one order of magnitude higher than that of ferromagnets. The ability to switch thermally stable ferrimagnets with a faster speed has important implications for future magnetic-memory applications.

Figure 12C:
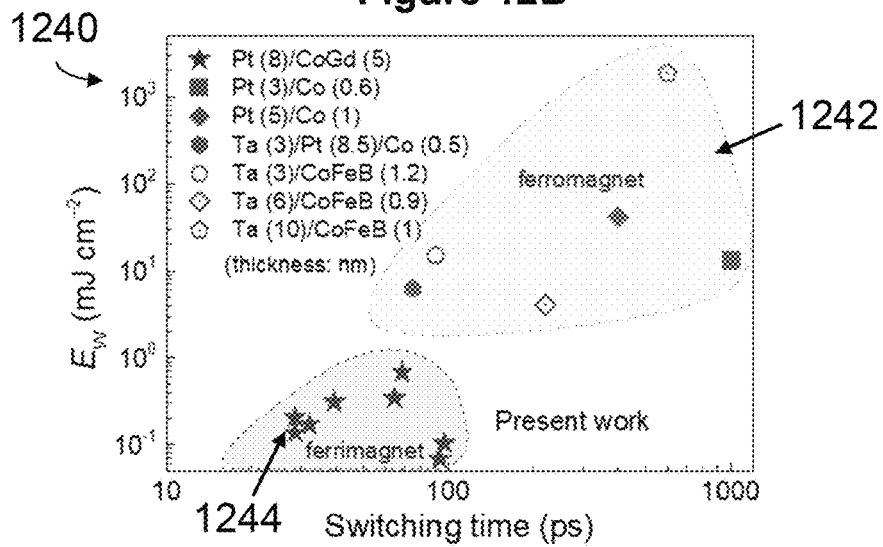

FIG. 12C shows a plot 1240 of switching energy consumption per unit area and switching time for ferromagnetic and ferrimagnetic systems. Data points having a square, a diamond, a pentagon, or a hexagon shape are related to ferromagnetic Pt/Co and Ta/CoFeB systems. These data points are grouped under 1242. Data points having a star shape are related to the Pt/CoGd ferrimagnet devices of the present disclosure and these data points are grouped under 1244. The lateral dimensions were normalized to 100 nm for comparison. From FIG. 12C, it is clear that ferrimagnet-based devices exhibit superior performance with smaller energy consumption and faster switching.

Domain Wall Dynamics During SOT Switching

In order to evaluate the characteristics of the SOT switching process, the time-resolved MOKE measurements were performed by focusing the laser spot at different positions on a CoGd wire. The laser is focused as a local probe of the magnetization. The temporal evolution of the magnetization is detected at each location along the wire. The DW propagates along the wire and traverses the probe region. The DW velocity can be obtained from the delay of an arrival time $\Delta t_a$ of domain wall between two locations with a distance $\Delta d$.

The DW velocity can then be determined by $v=\Delta d/\Delta t_a$. The instantaneous velocity can be obtained by fitting the time-resolved signal with an error function $S(t)=A\text{erfc}[2\sqrt{2}v_{DW}(t_a-t)/D]$, where A is a constant coefficient which is related to the laser absorption and Kerr rotation, $t_a$ is the arrival time for DW moving into the detection region. Details of this time-resolved MOKE measurement technique are provided in relation to FIGS. 14A to 15B below.

Figure 14A:
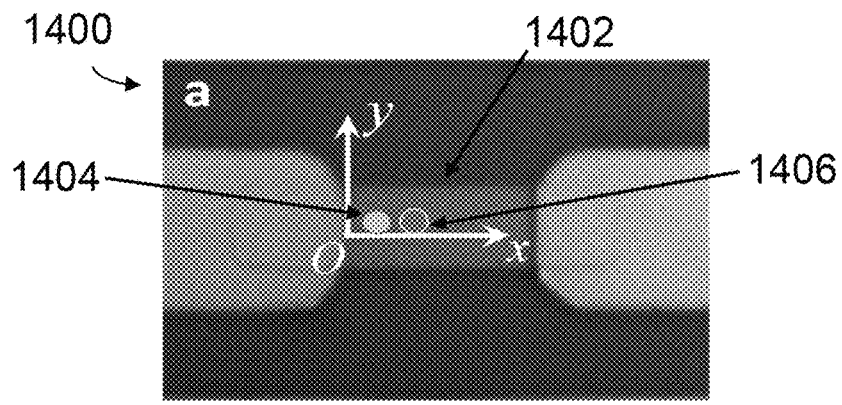
FIGS. 14A, 14B and 14C show diagrams in relation to domain nucleation and propagation in a $Co_{76}Gd_{24}$ wire in accordance with an embodiment, where

FIG. 14A shows an optical image 1400 of the CoGd device on which time-resolved MOKE measurements were performed. Time-resolved MOKE signals were acquired while moving a laser spot along the CoGd wire 1402. The switching process was evaluated using current pulses with a current density of $2.91\times10^{11}$ A m$^{-2}$ and longer duration (5 ns) to ensure a full switching. Two laser spot positions 1404, 1406 are also shown in FIG. 14A.

Figure 14B:
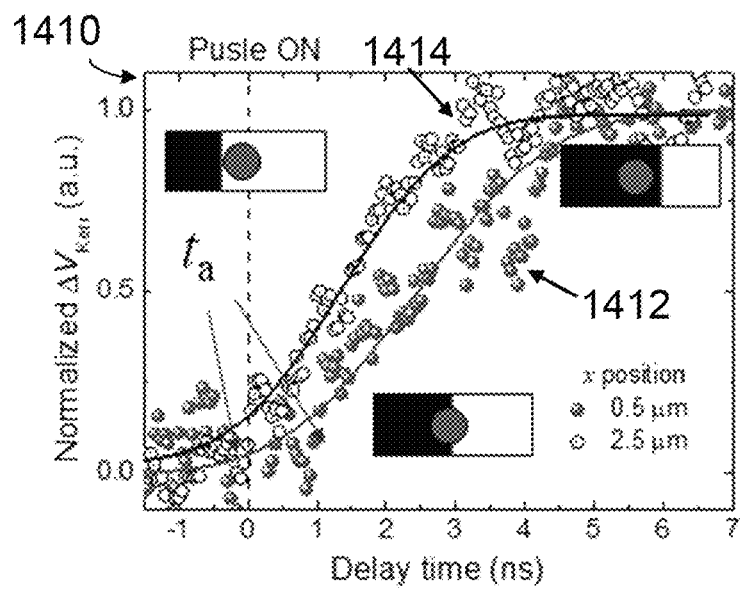

FIG. 14B shows plots 1410 of temporal evolution of time-resolved MOKE signals with a laser spot focusing at two different positions on the CoGd wire. The plot 1412 shows the temporal evolution of time-resolved MOKE signals when the laser spot is at a position x=0.5 µm, while the plot 1414 shows the temporal evolution of time-resolved MOKE signals when the laser spot is at a position x=2.5 µm. The laser spot for the position x=0.5 µm is shown as the laser spot 1404, while the laser spot for the position x=2.5 µm is shown as the laser spot 1406 in FIG. 14A. With reference to FIG. 14B, the switching process can be explained as follows. When the domain wall reaches the detection region, the Kerr signal starts to increase, corresponding to an arrival time t, on the plots 1412, 1414 of FIG. 14B. The Kerr signal continues to increase as the domain wall goes through the laser spot region. Finally, the Kerr signal becomes constant after the domain wall moves out of the detection region.

Figure 14C:
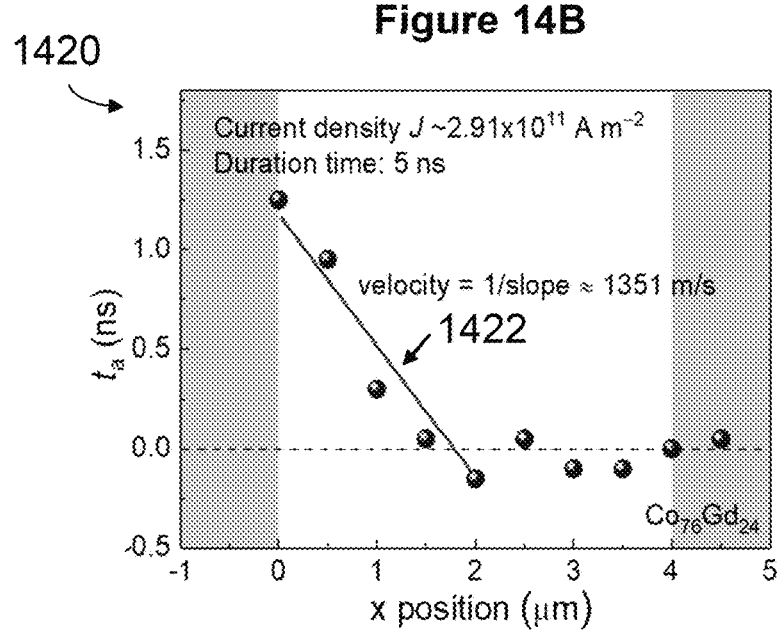

FIG. 14C shows a plot 1420 of arrival time $t_a$ for domain walls on the CoGd wire as a function of the central position x of the laser spot. FIG. 14C shows that $t_a$ monotonically decreases as a function of the laser spot position. This suggests that a single domain nucleates at the right side and propagates to the left side of the wire during the magnetization switching. Further, during each reversal of magnetization switching, the domain wall traverses the probe region of the laser spot in a switching time $t_{SW}$. The domain wall velocity $v_{DW}$ can be evaluated as $v_{DW}\sim D/t_{SW}$, where D is the diameter of the laser spot. Moreover, the linear fitting 1422 of the arrival time $t_a$ as shown in FIG. 14C indicates a stable domain propagation, corresponding to an average domain wall velocity of ~1351 m s$^{-1}$ with the current density J=$2.91\times10^{11}$ A m$^{-2}$ and pulse duration $\tau_p$=5 ns. This is in line with the result of velocity using $v_{DW}\sim D/t_{sw}$=2.8 µm/2.2 ns=1272 m s$^{-1}$. For completeness, D is the diameter of the laser spot with a measured value of 2.8 µm, while $t_{sw}$ can be estimated, for example, from FIG. 15B based on the time taken for the Kerr signal to switch from one flat region (e.g. where the MOKE signal is at approximately 13 µV) to the other flat region (e.g. where the MOKE signal is close to 0.5 µV).

Figure 15A:
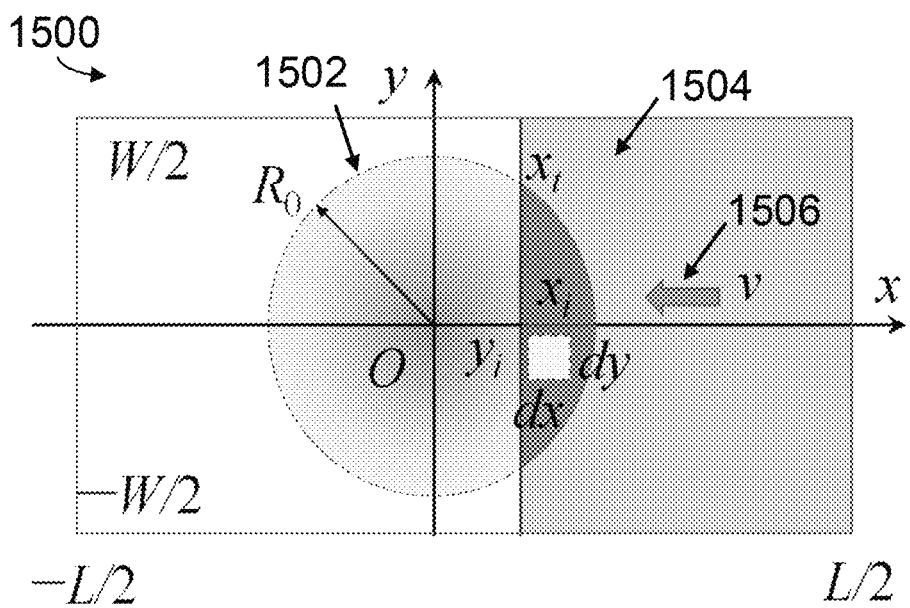
FIGS. 15A and 15B show diagrams in relation to MOKE measurements of the $Co_{76}Gd_{24}$ wire used in FIGS. 14A, 14B and 14C in accordance with an embodiment, where

Further, an analytical model can be utilized to interpret the SOT switching process and to extract the domain wall velocity from the time resolved signal of FIG. 14B. FIG. 15A shows a schematic diagram 1500 of a MOKE signal on a portion of the wire, where a dashed circle 1502 as shown is a detection region of the laser spot. The shaded region 1504 is the nucleated domain which is propagating to the left side with a velocity of $v_{DW}$ 1506.

The change of the MOKE signal S(t) can be expressed with an error function $$S(t)\approx A\text{erfc}[(x(t)/R_0)]=A\text{erfc}[2\sqrt{2}v_{DW}(t_a-t)/D] \quad (4),$$

where the constant coefficient A is related to the power, distribution, and absorption of the laser, as well as the properties of the magnetic films, such as the thickness and Kerr rotation.

Figure 15B:
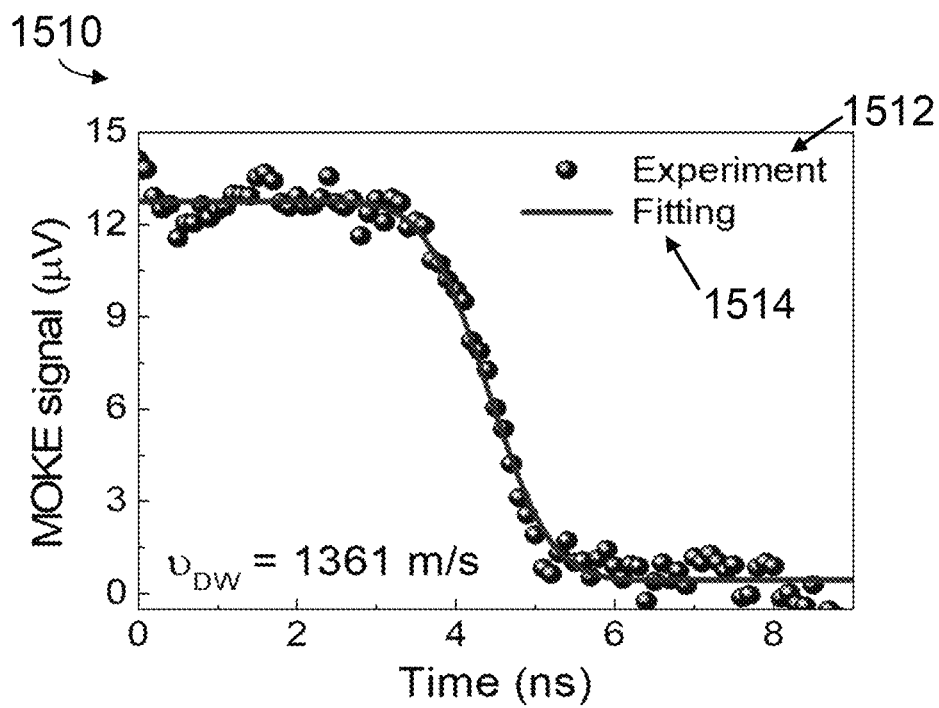

FIG. 15B shows a plot 1510 of measured temporal evolution of MOKE signal in the Co$_{76}$Gd$_{24}$ wire with a current density of ~$2.91\times10^{11}$ A m$^{-2}$ and a pulse duration of 5 ns. The time-resolved MOKE signal data 1512 was fitted with the Equation (4) above. The fitted line is shown as 1514 in FIG. 15B. From this, the domain velocity is extracted as ~1361 m s$^{-1}$ in Co$_{76}$Gd$_{24}$, with a current density J~$2.91\times10^{11}$ A m$^{-2}$ and pulse duration of 5 ns. This result obtained from FIG. 15B is consistent with the results obtained from FIG. 14C above.

With the methods described in relation to FIGS. 14A to 15B above, insight into the SOT switching dynamics in the ferrimagnetic system CoGd can be evaluated using the DW motion that accompanies the magnetization switching process. The SOT switching in the ferrimagnet CoGd occurs via DW nucleation at one edge and its subsequent expansion, which is confirmed by measuring the domain arrival time, fa, at different positions on the wire.

Figure 16A:
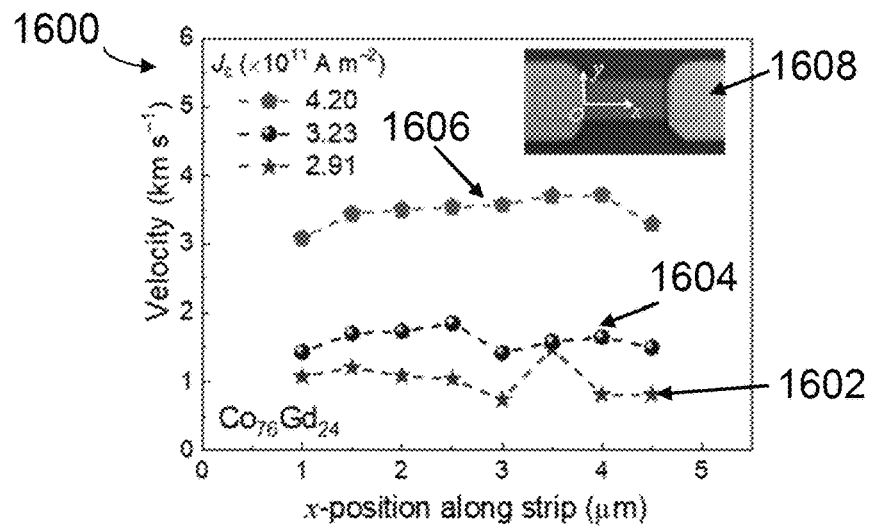
FIGS. 16A, 16B and 16C show plots in relation to domain wall motions in CoGd devices in accordance with an embodiment, where

FIG. 16A shows plots 1600 of domain wall velocities at different positions along the CoGd wire for three current densities, namely J=$2.91\times10^{11}$ A m$^{-2}$, J=$3.23\times10^{11}$ A m$^{-2}$, and J=$4.2\times10^{11}$ A m$^{-2}$. The domain wall velocities extracted from the time-resolved signal at different positions along the wire for the current densities J=$2.91\times10^{11}$ A m$^{-2}$, J=$3.23\times10^{11}$ A m$^{-2}$, and J=$4.2\times10^{11}$ A m$^{-2}$ are represented by plots 1602, 1604 and 1606, respectively. The inset 1608 of FIG. 16A shows an optical image of the CoGd device on which the time-resolved MOKE measurements were performed. The definitions of the coordinate axes are also shown. From FIG. 16A, it is observed that $v_{DW}$ is relatively insensitive to the measurement positions of the CoGd wire.

Figure 16B:
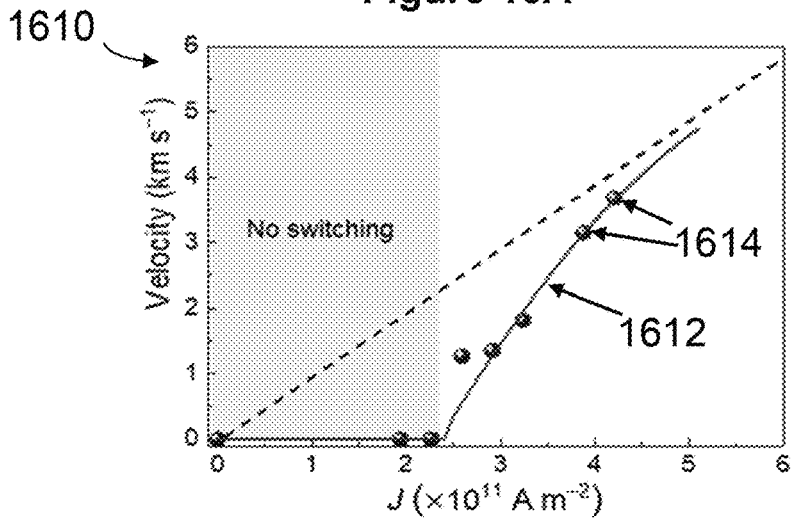

FIG. 16B shows a plot 1610 of domain wall velocity as a function of the current density at the center of the Co$_{76}$Gd$_{24}$ wire. The line 1612 shows a fitted curve through the experimental data points 1614. From the FIG. 16B, it is observed that a very high speed of $v_{DW}$~3.5 km s$^{-1}$ is viable with a moderate current density of $4.2\times10^{11}$ A m$^{-2}$.

Figure 16C:
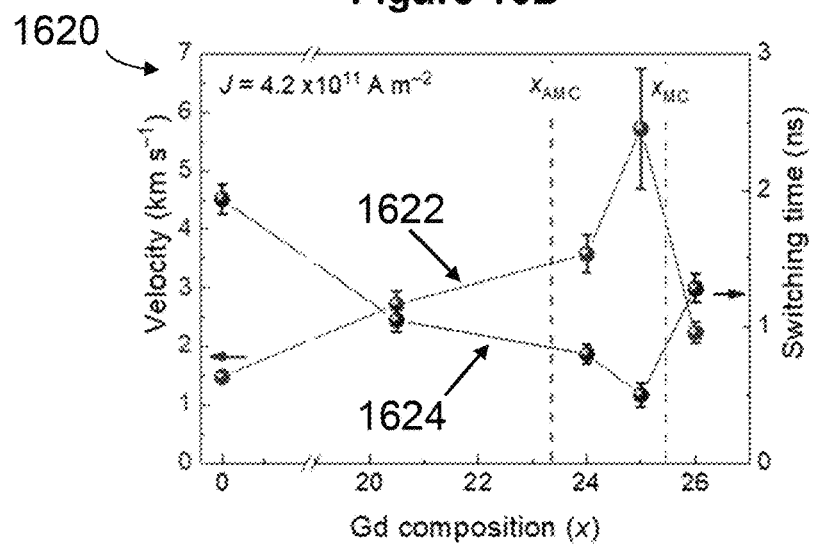

The effect of antiferromagnetic coupling on the ultrafast switching and domain wall motion is further elucidated by studying the composition dependence. This is shown in FIG. 16C. FIG. 16C shows plots 1620 of the domain wall velocity 1622 and switching time 1624 as a function of Gd composition where the error bars are the standard deviations from three repeated measurements.

As shown in FIG. 16C, the switching and domain wall speed in a pure Co sample (0.8 nm thick) is ~3 to 5 times slower compared to that of CoGd samples. As the samples approach the compensation points, $t_{SW}$ decreases and $v_{DW}$ increases. The maximum $v_{DW}$ is expected to appear from the sample close to the angular momentum compensation point (Co$_{76}$Gd$_{24}$). On the contrary, the Co$_{75}$Gd$_{25}$ sample exhibits the shortest switching time of ~0.5 ns and fastest domain wall velocity of ~5.7 km s$^{-1}$. This discrepancy can be explained by the current-induced heating effect which raises the temperature of Co$_{75}$Gd$_{25}$ sample towards its angular momentum compensation temperature $T_{AMC}$. At present, this is the highest current-driven DW velocity observed at room temperature in any magnetic system.

Figure 17A:
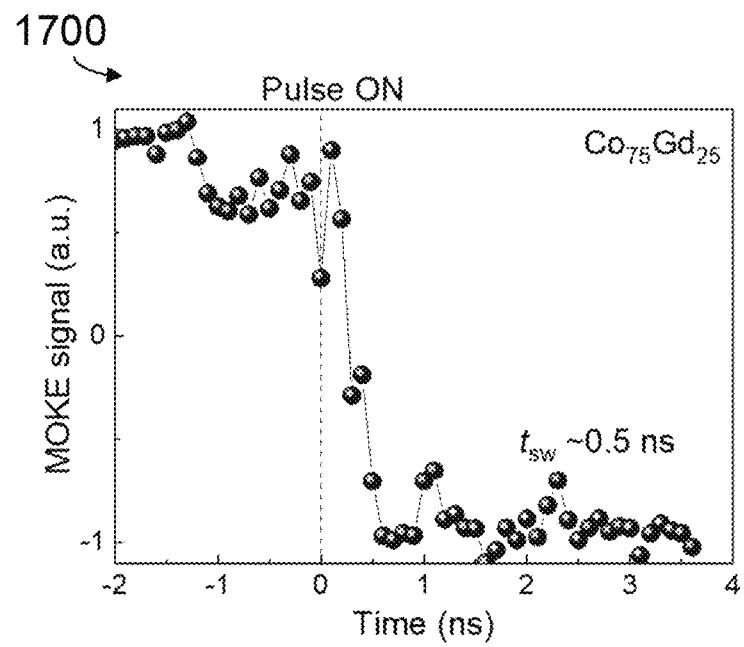
FIGS. 17A and 17B show time-resolved MOKE signals for two different CoGd compositions with an external magnetic field $H_x$=1444 Oe, a current density J=4.2×10$^{11}$ A m$^{-2}$ and a pulse duration $\tau_p$=5 ns in accordance with an embodiment, where
Figure 17B:
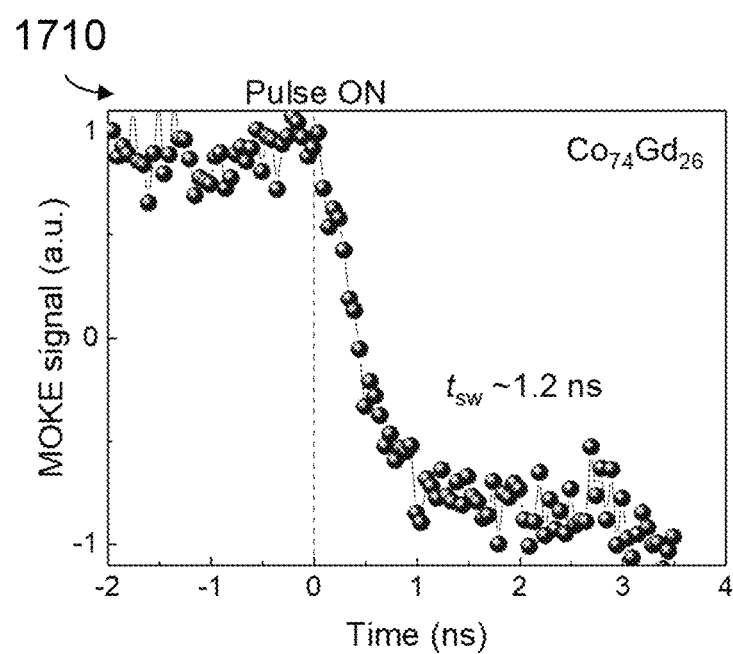

Under similar measurement conditions with $H_x$=1444 Oe, J=$4.2\times10^{11}$ A m$^{-2}$, and $\tau_p$=5 ns, the temporal evolution of normalized time-resolved MOKE signals 1700, 1710 are shown in FIGS. 17A and 17B for the compositions of $Co_{75}Gd_{25}$ and $Co_{74}Gd_{26}$ respectively. The switching time is extracted to be 0.5 and 1.2 ns, respectively.

The SOT induced switching dynamics was also investigated by measuring the switching probability with all electrical measurements. The switching probability is obtained by measuring the resistance of anomalous Hall effect ($R_{AHE}$) after injection of a current pulse with a current density J and a pulse duration $\tau_p$. For the measurements, CoGd ferrimagnet films were patterned into a pillar with a diameter of 1000 nm on top of platinum (Pt) Hall crosses. Sub-nanosecond current pulses were applied in the Pt channel and an external in-plane magnetic field $H_{ext}$ was applied to assist the deterministic SOT switching. The magnetization was initialized to a specific state by using a large d.c. current before applying the current pulses. The cumulative switching probability is defined as $$P_{SW}(J,\tau_p) = [R_{AHE}^{write}(J,\tau_p) - R_{AHE}^{reset}]/\Delta R_{AHE} \quad (5),$$

where $R_{AHE}^{write}(J, \tau_p)$ and $R_{AHE}^{reset}$ are the measured $R_{AHE}$ after the pulse injection and after the initialization, respectively. $\Delta R_{AHE}$ indicates the difference of $R_{AHE}$ between "up" and "down" magnetization states. Each data point was acquired by averaging over 20 trials. The J value of the injected pulse is determined by measuring the transmitted signal through the Pt/CoGd device.

Figure 18A:
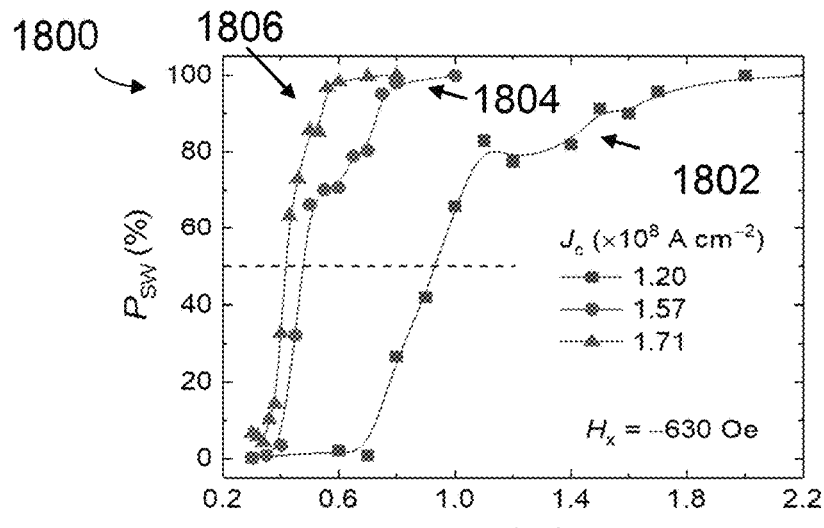
FIGS. 18A, 18B and 18C show plots of spin-orbit torque switching in CoGd devices using current pulses in accordance with an embodiment, where
Figure 18B:
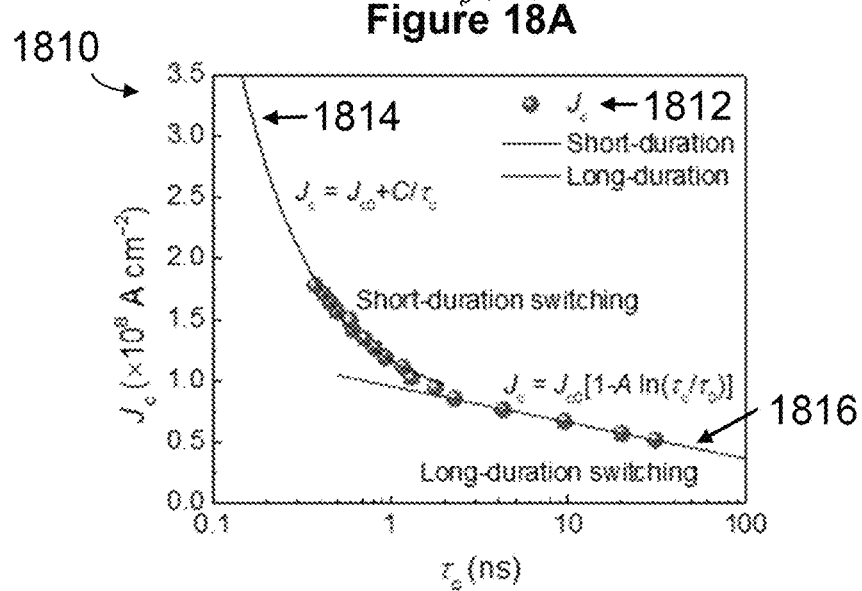
Figure 18C:
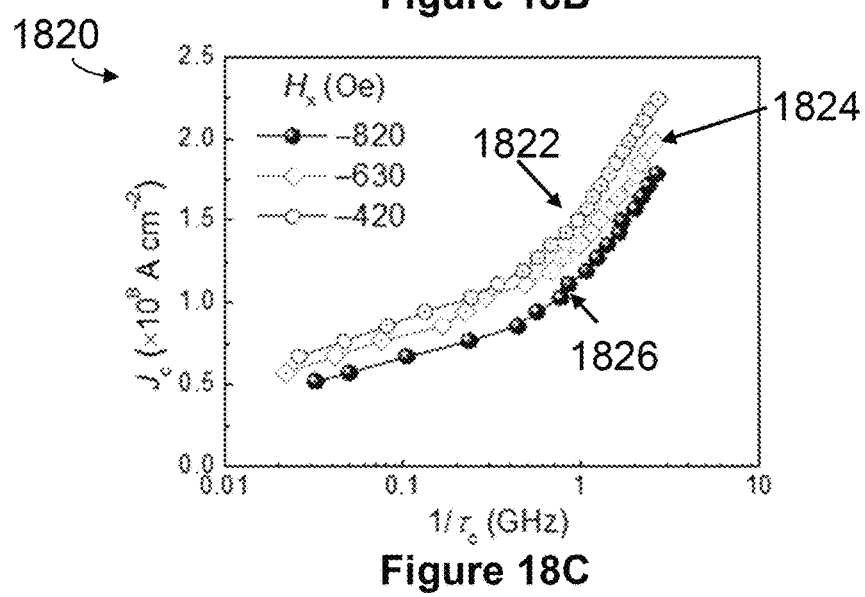

FIGS. 18A, 18B and 18C show the SOT switching results of the patterned Pt/$Co_{80.5}Gd_{19.5}$ device under nanosecond current pulses at $H_{ext}$=−630 Oe. FIG. 18A shows the representative measurements of the cumulative switching probability $P_{sw}$ as a function of current pulse $\tau_p$ for different values of current density J. The cumulative switching probability $P_{sw}$ for the current densities J=1.20×10⁸ A cm⁻², J=1.57×10⁸ A cm⁻² and J=1.71×10⁸ A cm⁻² are represented by plot 1802, 1804 and 1806, respectively. For the plots 1802, 1804, 1806, a "down" to "up" switching is observed upon injecting a positive current pulse with a negative $H_{ext}$ is applied. The observed $P_{sw}$ increases with respect to increasing $\tau_p$.

From the repeated $P_{sw}$ measurements with varying J and $\tau_p$, the switching diagram is constructed as shown in FIG. 18B, where the values of J and $\tau_p$ to achieve $P_{sw}$=50% is defined as the critical switching current density ($J_c$) and critical pulse duration ($\tau_c$). FIG. 18B shows a plot 1810 of the measured critical switching current density as a function of the critical pulse duration with $H_x$=−630 Oe, The data points 1812 are fitted with two curves 1814, 1816 for a short-duration switching regime and a long-duration switching regime respectively. As shown in FIG. 18B, the switching can be achieved with $\tau_c$~0.45 ns for $J_c$=1.57×10⁸ A cm⁻². The plot 1810 indicates that the $J_c$ decreases with a longer $\tau_p$, which is expected from SOT-driven magnetization switching dynamics. These two distinct regimes shown in FIG. 18B are similar to the SOT switching in ferromagnets such as spin-torque dominated regime at $\tau_c$<2 ns and the thermally activated regime at $\tau_c$>2 ns.

FIG. 18C shows plots 1820 of the critical switching current density as a function of $1/\tau_c$ with different magnetic fields. The critical switching current density as a function of $1/\tau_c$ for the magnetic fields $H_x$=−420 Oe, $H_x$=630 Oe and $H_x$=820 Oe are represented by plots 1822, 1824 and 1826, respectively. The two regimes as shown in FIG. 18B can also be observed between $J_c$ and $1/\tau_c$ in FIG. 18C.

Optimization of SOT Switching Speed and Energy Consumption

Since the SOT switching and DW motion relies on the current pulse configurations (amplitude and duration), other values of the current density (J) and pulse duration ($\tau_p$) used for SOT switching were also investigated. This is shown in FIGS. 19A and 19B for the near compensated sample ($Co_{76}Gd_{24}$) at room temperature.

Figure 19A:
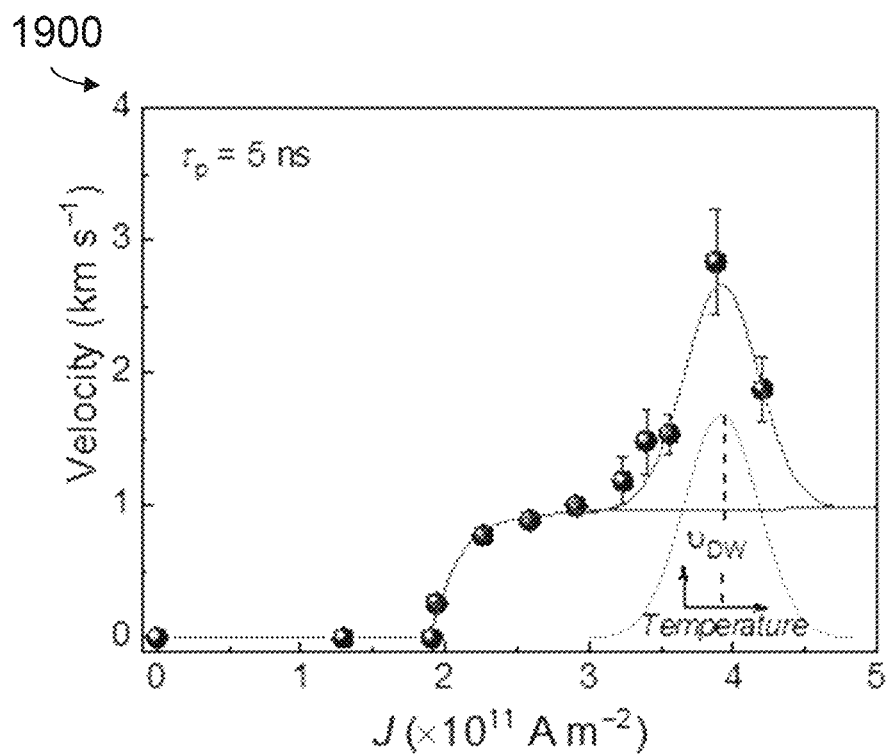
FIGS. 19A and 19B show plots of domain wall velocity as a function of current density and pulse duration for a near compensated $Co_{76}Gd_{24}$ device in accordance with an embodiment, where
Figure 19B:
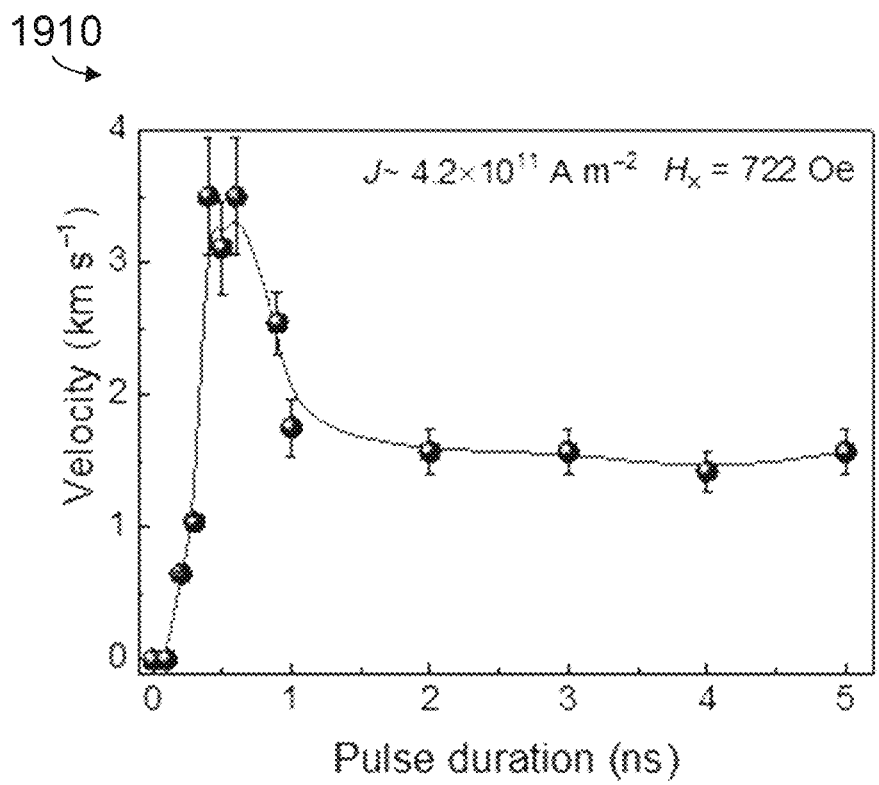

FIG. 19A show a plot 1900 of domain wall velocity as a function of current density J with pulse duration $\tau_p$=5 ns for $H_x$=−722 Oe, and FIG. 19B shows a plot 1910 of domain wall velocity (v~$D/t_{sw}$) as a function of pulse duration $\tau_p$ with J=4.2×10¹¹ A m⁻² and $H_x$=722 Oe. The error bars are the standard deviations from three repeated measurements. These plots 1900, 1910 were measured using a near compensated sample ($Co_{76}Gd_{24}$).

As shown in FIG. 19A, the DW velocity for the near compensated sample ($Co_{76}Gd_{24}$) increases, reaches a peak and then decreases as the current density increases. This behavior is in contrast to the calculated results previously shown in FIG. 8A, which predicts a constant rise of the DW velocity with the current density. In addition, the plot 1910 shows a peak value before saturating as shown in FIG. 19B. The above anomalous DW velocity is due to a strong dependence of the ferrimagnetic magnetic properties on temperature, which is strongly correlated to the current magnitude and its pulse width. As shown in the plot 1900, the initial increase in the DW velocity with increasing current density is a consequence of the enhanced spin injection and the temperature fluctuation, which drives the sample temperature towards $T_{AMC}$. An additional increase of the sample temperature with a higher current density will drive the sample away from the compensation region (crossover from Gd-rich to Co-rich regime), therefore the DW velocity decreases. This applies equally to the trend as shown by the plot 1910 of FIG. 19B. A similar rise of temperature with the current pulse width results in a peak of the DW velocity for the plot 1910 followed by a drop. Since the sample temperature saturates beyond a certain pulse duration, the DW velocity does not constantly decline but saturates instead.

From the FIGS. 18A to 19C, it is clear that the dependence of switching dynamics on both J and $\tau_p$ provides an important strategy for designing ferrimagnet based SOT devices with both low energy dissipation and fast operation speed, which is typically not easy to achieve at the same time. An optimal condition for low power and fast speed can be obtained by tuning the current density and pulse duration. For example in the present near compensated sample ($Co_{76}Gd_{24}$), a high domain wall velocity of >3 km s⁻¹ can be achieved using a current pulse with a current density J=4.2×10¹¹ A m⁻² and sub-nanosecond pulse duration of 0.5 ns. From the FIGS. 12A to 19C, it can be concluded that an electric current comprising a sub-nanosecond current pulse having a pulse duration between 0.2 ns to 2 ns and a current density between 0.2×10¹² A m⁻² to 1×10¹² A m⁻² is sufficient to perform an ultrafast and energy-efficient switching in the compensated or near compensated CoGd devices.

Figure 20A:
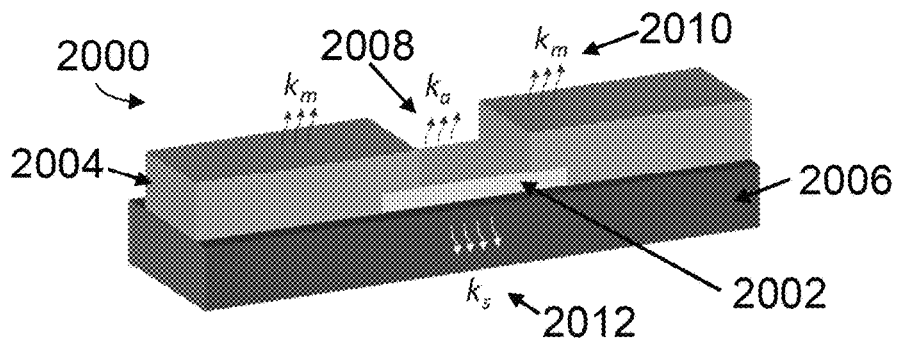
FIGS. 20A, 20B and 20C show diagrams in relation to simulated Joule heating effect on the magnetic properties of a ferrimagnetic CoGd device in accordance with an embodiment, where
Figure 20B:
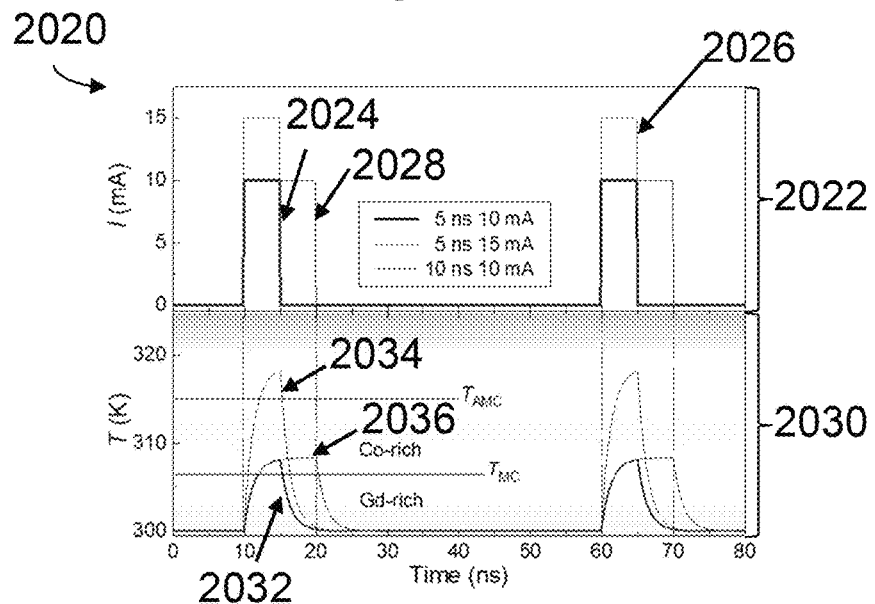
Figure 20C:
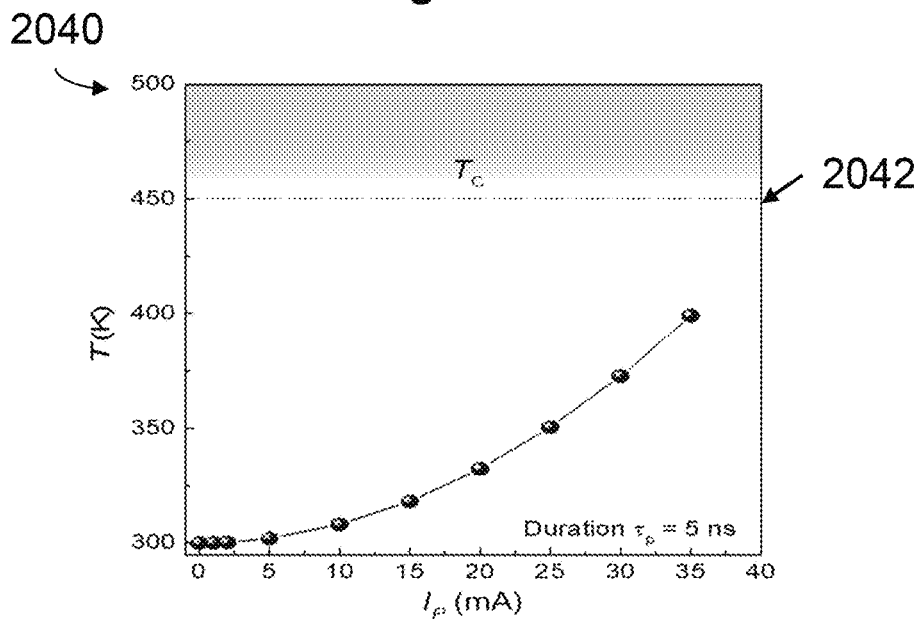

The heating effect of current pulses on the magnetic properties of a ferrimagnet, such as CoGd alloy, is further investigated in relation to FIGS. 20A, 20B and 20C.

FIG. 20A shows a schematic diagram 2000 illustrating heat transfer and dissipation in a ferrimagnetic device. The ferrimagnetic device comprises a ferrimagnetic material layer 2002 placed between two electrodes 2004. The ferrimagnetic material layer 2002 and the electrodes 2004 are formed on a substrate 2006. When a current pulse is injected, the temperature change of the samples is inevitable due to Joule heating. As angular momentum $A_s$ strongly depends on temperature, it is crucial to consider the temperature fluctuation during current injection. To estimate the temperature change induced by the current pulse, a numerical simulation was performed based on Joule heating and a heat transfer model in a solid. An energy balance inside the wire considers the heat generation $Q_g$ and accumulation $Q_a$ as well as heat dissipation $Q_d$. The accumulated heat is defined based on the change of temperature with $\Delta Q_a = C_p m \Delta T$, where $C_p$ is the thermal capacitance, m is the mass of wire. The heat generation $\Delta Q_g$ can be expressed in terms of Joule heating as $\Delta Q_g = I(t)^2 R \Delta t$, where I(t) is the current, R is resistance and $\Delta t$ is a finite time step.

Heat transfers 2008, 2010, 2012 to the surrounding air, to the electrodes 2004 and to the substrate 2006, respectively, are taken into consideration as shown in FIG. 20A. The heat dissipation is the sum of the heat transfers to the surroundings (e.g. air, the electrodes 2004 and the substrate 2006) and is given by $\Delta Q_d = \Delta t \Sigma_i k_i A_i (T_i(t) - T_R)/L_i$, where $k_i$ is the thermal conductivity, $A_i$ is the cross section area, $L_i$ is the distance, $T_i(t)$ and $T_{RM}$ are the temperature of the device and the ambient temperature, respectively. The thermal accumulation in $\Delta t$ can be estimated using:

$$\Delta Q_a = \Delta Q_g - \Delta Q_d = \left(I(t)^2 R - \sum_i k_i A_i (T_i(t) - T_{RM})/L_i\right) \Delta t. \quad (6)$$

Thus, the change of the temperature $\Delta T(t) = \Delta Q_a(t)/C_p m$. The time evolution of temperature T(t) can be estimated by $T(t_n + \Delta t) = Q_a(t_n)/C_p m + T(t_n)$.

FIG. 20B shows plots 2020 of temperature response of rectangular current pulses with different pulse duration $\tau_p$ and amplitude $I_P$. The waveforms of the current pulses are shown in a top panel 2022 of FIG. 20B. The rectangular current pulses used for this simulation are: (i) $\tau_p=5$ ns, $I_P=10$ mA (as shown by 2024); (ii) $\tau_p=5$ ns, $I_P=15$ mA (as shown by 2026); (iii) $\tau_p=10$ ns, $I_P=10$ mA (as shown by 2028). In the present experiments, the maximum $I_p$ applied to the CoGd microwire is ~22 mA, corresponding to a current density of ~4.2×10$^{11}$ A m$^{-2}$. Other parameters of material properties used in the calculation are summarized as follows: the resistance R=100$\Omega$, the density of $\rho=21.45\times10^3$ kg m$^{-3}$, the volume V=10 μm×3 μm×18 nm=5.4×10$^{-19}$ m$^{-3}$, the thermal capacitance $C_p=135$ J kg$^{-1}$ K$^{-1}$, the thermal conductivity of the substrate $k_s=130$ W m$^{-1}$ K$^{-1}$, the electrodes $k_m=400$ W m$^{-1}$ K$^{-1}$ and the air $k_a=0.026$ W m$^{-1}$ K$^{-1}$. The surroundings were considered as a heat sink at a constant temperature ($T_{RM}=300$ K). The heat flows out of the wire via the substrate with a distance of $d_s=670$ μm and a cross section area of $A_s=10$ μm×3 μm=30 μm$^2$ and through the electrodes with a distance of $d_m=5$ μm with partially covering of $A_m=2$ μm×3 μm=6 μm$^2$. The heat dissipation of the air is relatively small. The equations were solved by substituting the above parameters with a time step of 0.1 ns.

The corresponding temperatures of the CoGd device in relation to the waveforms of the current pulses in the top panel 2022 are shown in a bottom panel 2030 of FIG. 20B. The temperature response plots for the current pulses (i) $\tau_p=5$ ns, $I_P=10$ mA, (ii) $\tau_p=5$ ns, $I_P=15$ mA, and (iii) $\tau_p=10$ ns, $I_P=10$ mA are shown in plots 2032, 2034 and 2036 respectively. As shown in the bottom panel 2030 of FIG. 20B, the temperature of the CoGd device exhibits a sudden increase as the pulse turns on and a decrease when it turns off.

FIG. 20C shows a plot 2040 of maximum calculated temperature as a function of current pulse amplitude $I_P$ with a pulse duration of $\tau_p=5$ ns. The dashed line 2042 indicates the Curie temperature $T_C$ of the ferrimagnet CoGd. Devices with $T_{AMC} > T_{RM}$ experience a transition to $T_{AMC}$ during the injection of current pulse. FIG. 19A above shows the domain wall velocity reaches a peak, corresponding to the $T_{AMC}$.

Effects of Device Scaling on Switching Time and Energy Consumption of SOT Switching Switching magnetization of nanoscale magnetic dots is one of the most crucial processes for electronics application. To characterize and verify the dimensional scaling on the switching time and energy consumption of the ultrafast SOT switching in the ferrimagnet alloy CoGd of FIG. 5A, Hall-cross devices with magnetic pillars of different diameters were fabricated from the sputter-deposited film stacks of Pt (8 nm)/Co$_{79}$Gd$_{21}$ (5 nm).

Figure 21A:
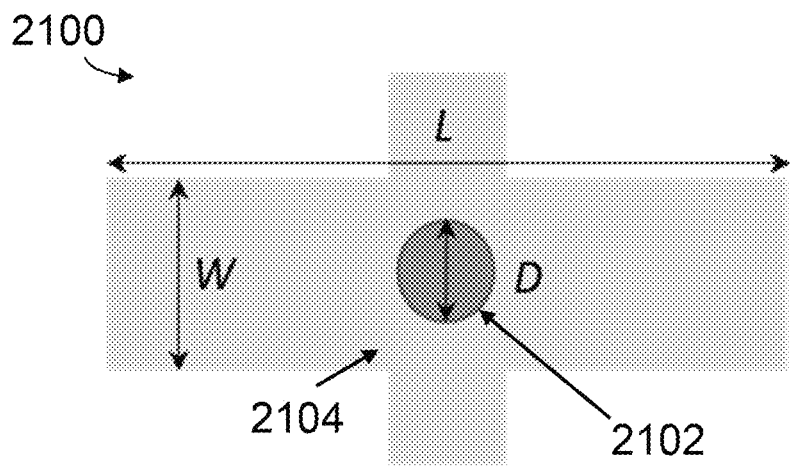
FIGS. 21A, 21B, 21C and 21D show diagrams in relation to scaling of switching time and energy consumption on SOT switching in the ferrimagnet alloy CoGd of FIG. 5A in accordance with an embodiment, where

FIG. 21A shows a schematic diagram 2100 of one of these Hall-bar devices. The Hall-bar device as shown in FIG. 21A comprises a magnetic pillar 2102 with a diameter D. The magnetic pillar 2102 is formed on top of a Hall cross channel 2104 having a width W and a length L as shown in FIG. 21A.

A series of Hall-cross devices were fabricated with nano-magnetic pillars of various nominal diameters (D, ranging from 100 to 1500 nm) on top of Hall cross channel. The width (W) and length (L) of the channel were scaled down with the ratios W/D=1.5~1.9 and L/D=4~8, respectively. Switching probability measurements, similar to those as shown in FIG. 18A, were performed on these Hall-bar devices using current pulses having a current density $J_p \sim 7.84\times10^{11}$ A m$^{-2}$ but with varying pulse durations ($\tau$). These switching probability measurements were performed under an external magnetic field $H_x=-820$ Oe. The critical pulse duration ($\tau_c$) for SOT switching with $P_{SW}=50\%$ was then extracted.

Figure 21B:
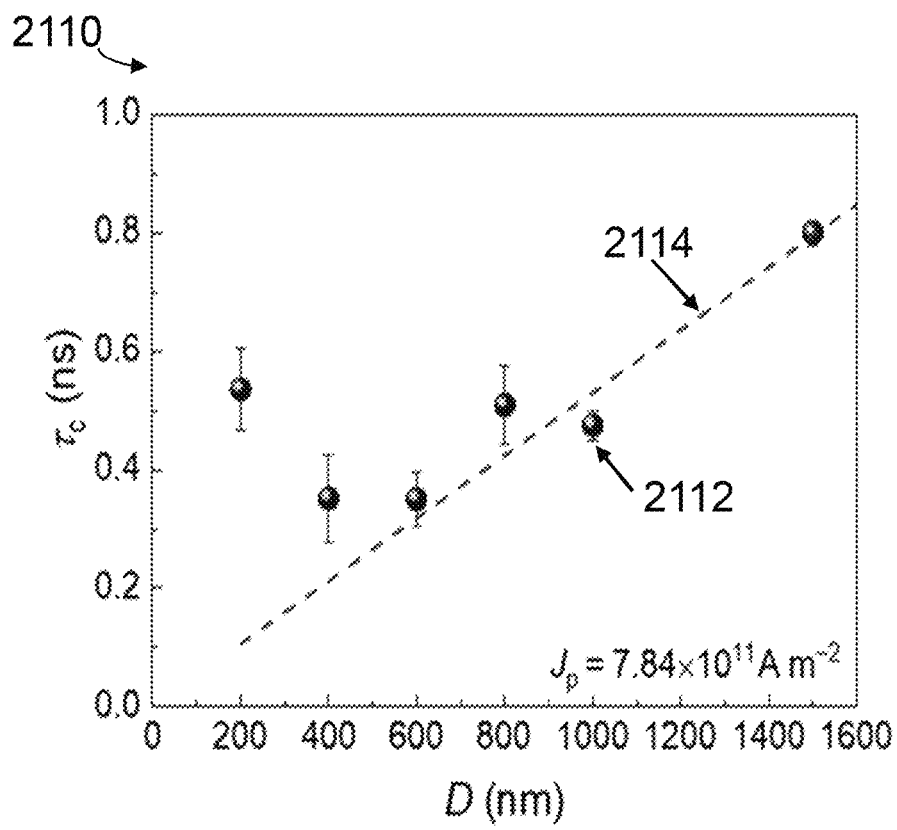

FIG. 21B shows a plot 2110 of extracted current pulse durations 2112 at a switching probability $P_{SW}$ of 50% for different nano-pillar diameters using a current pulse with a current density $J_p=7.84\times10^{11}$ A m$^{-2}$ and under an external magnetic field $H_x=-820$ Oe. For the devices with D more than or equal to 400 nm, the pulse width of the critical switching current $\tau_c$ decreases with reducing device diameter D. A linear scaling to D is shown by a dash line 2114 in FIG. 21B, which is in accordance with domain wall propagation for SOT switching.

Figure 21C:
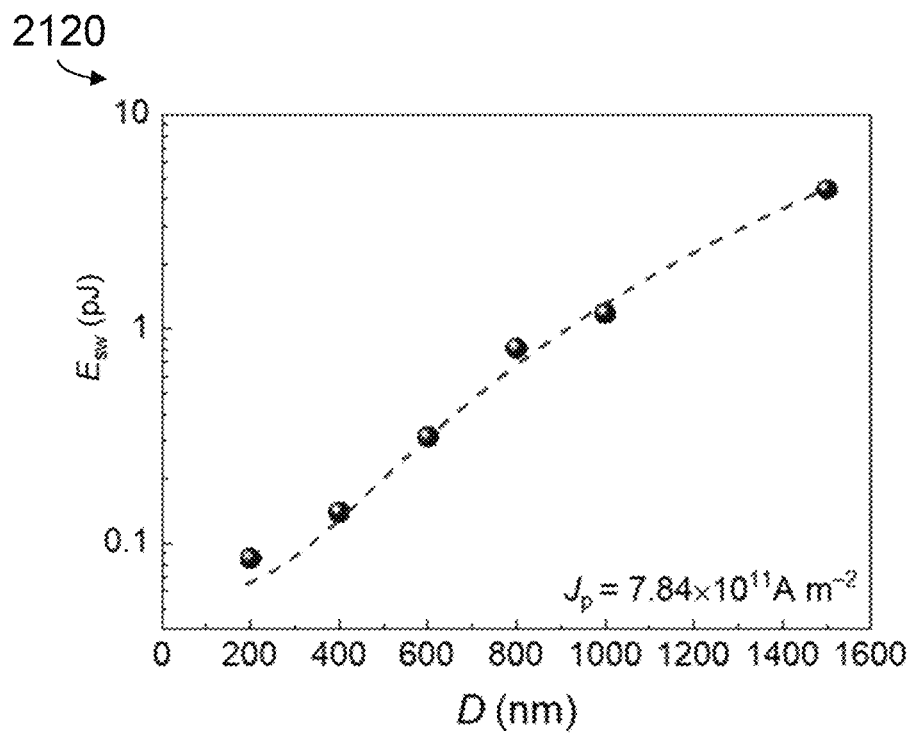

FIG. 21C shows a plot 2120 of estimated energy consumption ($E_{sw}$) for different nano-pillar diameters D. The energy consumption ($E_{sw}$) during switching is estimated using $E_{sw}=I_p^2 R \tau_c$. Here, $I_p$ is the current flowing in the bottom Pt layer under the magnetic nano-pillar. The energy consumption ($E_{sw}$) as shown in FIG. 21C is comparable to the normalized results as shown previously in FIGS. 12C and 13.

Figure 21D:
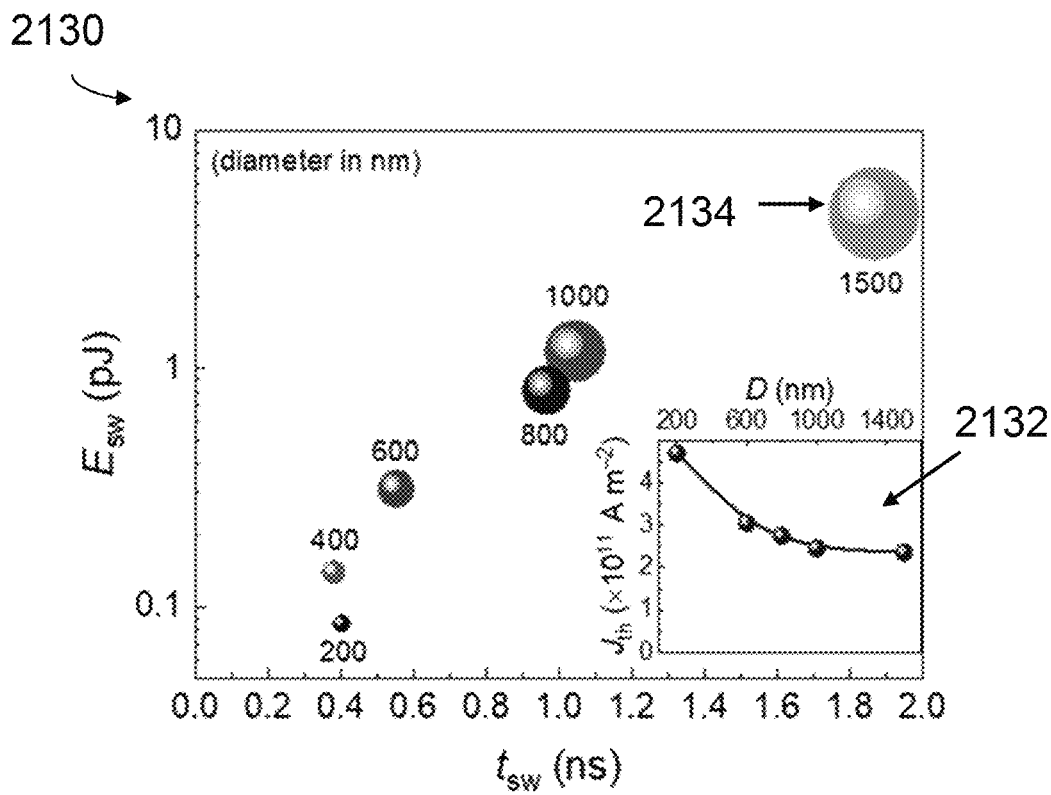

FIG. 21D shows a plot 2130 of characteristic switching time ($t_{sw}$) and energy consumption for different diameters D of the magnetic nano-pillars 2102. The inset 2132 of FIG. 21D shows the critical d.c. switching current density $J_{th}$ for different diameters D. The diameter D (in nm) of the magnetic pillar 2102 is indicated next to each of the dots as shown in the plot 2130. A dot 2134 with D=1500 nm is indicated on FIG. 21D as an example.

The characteristic switching time ($t_{sw}$) is estimated using $J_p=J_{th}(1+t_{sw}/\tau_c)$. Here, $J_{th}$ is the critical d.c. switching current. It should be noted that for the device with D=200 nm the $\tau_c$ increases due to the increase in the effective anisotropy field as a result of reduced demagnetization for a smaller sized device. For the devices with D=100 nm, no perpendicular magnetic anisotropy signals were electrically detected in these experiments and therefore no data for D=100 nm is shown in FIG. 21D.

As shown by the inset 2132, the critical switching current density ($J_{th}$), measured by sweeping the d.c. current increases by a factor of ~2 as the diameter D decreases from 1500 to 200 nm. From the scaling of characteristic switching time $t_{sw}$ and energy consumption $E_{sw}$ with the device size as shown in FIG. 21D, it is clear that the smaller the device, the faster switching, and the lower energy consumption it achieves.

In summary, an ultrafast and energy-efficient switching has been demonstrated in the exemplary embodiment using a compensated ferrimagnetic alloy CoGd. The switching time can be reduced to a sub-nanosecond regime with a power consumption that is one to two orders of magnitude lower than that of ferromagnetic SOT systems. The antiferromagnetically coupled Co—Gd links accelerate the spin momentum transfer, resulting in a fast collective behavior (magnetization switching/domain wall motion). Time-resolved measurements show a domain wall velocity of 5.7 km s$^{-1}$, which is the fastest domain wall velocity among the reported values of current-induced domain wall motion. However, the fastest expected switching, at the angular momentum compensated composition point, is not obtained due to Joule heating. Therefore, an optimal strategy for achieving low power and fast speed, by choosing the appropriate current pulse density and duration, is provided. For example, the composition of the CoGd alloy can be chosen such that $Co_{100-x}Gd_x$ where x has a range of 24 to 27 so as to account for potential Joule heating effect. As noted above, an electric current comprising a sub-nanosecond current pulse having a pulse duration between 0.2 ns to 2 ns and a current density between $0.2 \times 10^{12}$ A m$^{-2}$ to $1 \times 10^{12}$ A m$^{-2}$ is sufficient to perform an ultrafast and energy-efficient SOT switching in the compensated or near compensated CoGd. It should be appreciated that the range of pulse duration of between 0.2 ns to 2 ns, and the range of current density of between $0.2 \times 10^{12}$ A m$^{-2}$ to $1 \times 10^{12}$ A m$^{-2}$ may also be applicable to other material systems as listed in the alternative embodiments below.

Alternative embodiments of the invention include: (1) the magnetic layer 102 comprising one or more of: (i) other ferrimagnetic material systems such as CoPd, CoTb, GdFeCo, and TbFeCo alloys, (ii) ferrimagnetic Heusler alloys such as $Mn_3Ge$ and MnGa, (iii) ferrimagnetic multilayers ($[Co/Tb]_n$, $[Co/Pd]$, and $[Co/Gd]_n$), and (iv) ferromagnet (such as Fe, Co, Ni and their alloys, and CoFeB alloy)/ferrimagnet hybrid structures (such as Co/CoTb, CoFeB/CoGd); (2) the spin source layer 104 comprising one or more of: (i) heavy metal such as Ta, W, Pt, Pd, Ir, Bi and their alloys, (ii) antiferromagnet such as PtMn and IrMn alloy, (iii) topologic insulators such as $Bi_2Te_3$ and $Bi_2Se_3$, (iv) two-dimensional materials such as $MoS_2$ and $WTe_2$, and (iv) heterostructures such as CoFeB/(Ti, Pt, or Ta) and NiFe/(Ti, Pt, or Ta); (3) the first and second pinning regions 106, 108 (A and B) being created by: (i) introducing geometrical modifications such as anti-notched structures, (ii) ion-doping and/or (iii) different widths and/or thicknesses of the magnetic layer 102 at the first and second pinning regions 106, 108 (e.g. in comparison to that of the switchable region 114); (4) an interfacial layer formed between the magnetic layer 102 and the spin source layer 104 for enhancing spin generation or spin transparency, the interfacial layer being formed by interfacial alloying and/or monatomic layers (such as Hf); (5) an interfacial layer formed between the magnetic layer 102 and the tunneling barrier layer 118 for enhancing spin generation or spin transparency, the interfacial layer being formed by interfacial alloying and/or monatomic layers (such as Hf); (6) the magnetic layer 102 comprises a strong spin-orbit interaction systems with low-symmetry crystal structure such as $IrMn_3$ and $WTe_2$, and the field-free switching is realized using an out-of-plane spin generation; (7) the reference magnetic layer 120 having a fixed reference magnetization direction in the "up" or "down" direction; (8) the tunneling barrier layer 118 comprising one of the insulators such as MgO, $AlO_x$, $SiO_2$, $HfO_x$, $MgAlO_x$, and $MgTiO_x$; (9) the reference magnetic layer 120 comprising one or more of; (i) ferromagnetic materials and their alloys such as Co, Fe, Ni, CoFe, FeB, CoB, CoFeB (ii) ferrimagnet alloys and multilayers such as FePt, CoGd, CoTb, GdFeCo, TbFeCo, $[Co/Tb]_n$, $[Co/Pd]$, and $[Co/Gd]_n$); (10) the magnetic layer 102 comprising a compensated ferrimagnet with a net magnetization below 50 emu/cm$^3$; (11) the compensated ferrimagnet has an angular momentum compensation temperature between 20° C. to 80° C.; (12) the magnetic layer 102 having an in-plane magnetic anisotropy such that the switchable magnetization direction is in the same plane as the planar surface of the magnetic layer 102. In this case, even though magnetization switching in devices comprising a magnetic layer having an in-plane magnetic anisotropy does not typically require an external magnetic field for deterministic switching, the SOT device 100 as shown in FIG. 1A provides an energy saving of about 3 times since the energy cost for creating a domain wall for a switching event is eliminated as a single domain wall can be reused in a continuous operation of the present SOT device 100 by moving the same domain wall back and forth between the first and second pinning regions 106, 108.

For the alternative embodiments in relation to (10) and (11), the wider range provide flexibility to account for cases where the joule heating effect is significant for example due to specific device structures or applications.

An exemplary embodiment of the SOT device 100 shows the switching region 114 between the first and second pinning regions 106, 108. This should not be construed as limiting and it is appreciated other device structure may be envisaged as long as a domain wall can be propagated between the first and second pinning regions 106, 108 to switch the switchable magnetization direction of the magnetic layer 102 between the first and second fixed magnetization directions.

Although only certain embodiments of the present invention have been described in detail, many variations are possible in accordance with the appended claims. For example, features described in relation to one embodiment may be incorporated into one or more other embodiments and vice versa.

The invention claimed is:
1. A spin-orbit torque device comprising:
   a first pinning region having a first fixed magnetization direction;
   a second pinning region having a second fixed magnetization direction which is in a different direction to the first fixed magnetization direction;
   a magnetic layer having a switchable magnetization direction; and
   a spin source layer configured to generate a spin current for propagating a domain wall between the first and second pinning regions to switch the switchable magnetization direction of the magnetic layer between the first and second fixed magnetization directions,
   wherein the switchable magnetization direction is initialized to the second fixed magnetization direction, the magnetic layer is adapted to interact with the spin current to propagate the domain wall from the first pinning region towards the second pinning region to switch the switchable magnetization direction from the second fixed magnetization direction to the first fixed magnetization direction;

wherein the magnetic layer comprises a switchable region formed between the first and second pinning regions, the first pinning region comprises a first pinning site and the second pinning region comprises a second pinning site, the first pinning site is adapted to pin the domain wall at a boundary between the first pinning region and the switchable region, and the second pinning site is adapted to pin the domain wall at a boundary between the second pinning region and the switchable region.

2. The spin-orbit torque device of claim 1, wherein the first fixed magnetization direction and the second fixed magnetization direction are opposite to each other.

3. A method for operating the spin-orbit torque device of claim 1, the method comprising:

initializing the first fixed magnetization direction of the first pinning region and the second fixed magnetization direction of the second pinning region to be in opposite directions;

initializing the switchable magnetization direction to the second fixed magnetization direction; and passing an electric current through the spin source layer to generate the spin current to propagate the domain wall from the first pinning region towards the second pinning region to switch the switchable magnetization direction from the initialized second fixed magnetization direction to the first fixed magnetization direction.

4. The method of claim 3, further comprising:

passing another electric current through the spin source layer to generate another spin current to propagate the domain wall from the second pinning region towards the first pinning region to switch the switchable magnetization direction from the first fixed magnetization direction to the second fixed magnetization direction.

5. The method of claim 3, wherein the electric current comprises a sub-nanosecond current pulse having a pulse duration between 0.1 ns to 2 ns and a current density between $0.2 \times 10^{12}$ A m$^{-2}$ to $1 \times 10^{12}$ A m$^{-2}$.

6. A spin-orbit torque device comprising:

a first pinning region having a first fixed magnetization direction;

a second pinning region having a second fixed magnetization direction which is in a different direction to the first fixed magnetization direction;

a magnetic layer having a switchable magnetization direction; and a spin source layer configured to generate a spin current for propagating a domain wall between the first and second pinning regions to switch the switchable magnetization direction of the magnetic layer between the first and second fixed magnetization directions, wherein the magnetic layer comprises a switchable region formed between the first and second pinning regions, the first pinning region comprises a first pinning site and the second pinning region comprises a second pinning site, the first pinning site is adapted to pin the domain wall at a boundary between the first pinning region and the switchable region, and the second pinning site is adapted to pin the domain wall at a boundary between the second pinning region and the switchable region.

7. The spin-orbit torque device of claim 6, wherein the first pinning region or the second pinning region is formed by geometrical modification, or by ion-doping.

8. The spin-orbit torque device of claim 6, wherein the first pinning region or the second pinning region is formed as a region having a different width or a different thickness to that of the switchable region.

9. The spin-orbit torque device of claim 6, wherein the spin-orbit torque device further comprises:

a reference magnetic layer having a fixed reference magnetization direction; and a tunneling barrier layer sandwiched between the reference magnetic layer and the magnetic layer, wherein the switchable magnetization direction is switchable between the first fixed magnetization direction and the second fixed magnetization direction to provide a low resistance state and a high resistance state of the spin-orbit torque device, the low resistance state being a state in which the switchable magnetization direction is in the same direction as the fixed reference magnetization direction and the high resistance state being a state in which the switchable magnetization direction is in an opposite direction as the fixed reference magnetization direction.

10. The spin-orbit torque device of claim 6, further comprises an interfacial layer formed between the magnetic layer and the spin source layer, the interfacial layer comprising an interfacial alloy, or one or more monatomic layers.

11. The spin-orbit torque device of claim 6, wherein the spin source layer comprises one of: a heavy metal, an antiferromagnet, a topological insulator, a two-dimensional material, and a heterostructure.

12. The spin-orbit torque device of claim 6, wherein the switchable magnetization direction is perpendicular to a planar surface of the magnetic layer.

13. The spin-orbit torque device of claim 6, wherein the magnetic layer comprises a compensated ferrimagnet with a net magnetization below 50 emu/cm'.

14. The spin-orbit torque device of claim 13, wherein the compensated ferrimagnet has an angular momentum compensation temperature between 20° C. to 80° C.

15. The spin-orbit torque device of claim 6, wherein the magnetic layer comprises $Co_{100-x}Gd_x$, where x has a range of 24 to 27.

16. The spin-orbit torque device of claim 1, wherein the spin current is generated from an electric current, the electric current comprises a sub-nanosecond current pulse having a pulse duration between 0.1 ns to 2 ns and a current density between $0.2 \times 10^{12}$ A m$^{-2}$ to $1 \times 10^{12}$ A m$^{-2}$.

17. A spin-orbit torque magnetic memory device comprising:

a reference magnetic layer having a fixed reference magnetization direction;

a magnetic layer comprising $Co_{100-x}Gd_x$ where x has a range of 24 to 27, the magnetic layer having a switchable magnetization direction;

a first pinning region having a first fixed magnetization direction;

a second pinning region having a second fixed magnetization direction different from the first fixed magnetization direction;

a tunneling barrier layer sandwiched between the reference magnetic layer and the magnetic layer; and a spin source layer arranged to generate a spin current to switch the switchable magnetization direction of the magnetic layer between the first fixed magnetization direction and the second fixed magnetization direction by propagating a domain wall between the first and second pinning regions to provide a low resistance state and a high resistance state of the spin—orbit torque memory device, the low resistance state being a state in which the switchable magnetization direction is in the same direction as the fixed reference magnetization direction and the high resistance state being a state in which the switchable magnetization direction is in an opposite direction as the fixed reference magnetization direction;

wherein the magnetic layer comprises a switchable region formed between the first and second pinning regions, the first pinning region comprises a first pinning site and the second pinning region comprises a second pinning site, the first pinning site is adapted to pin the domain wall at a boundary between the first pinning region and the switchable region, and the second pinning site is adapted to pin the domain wall at a boundary between the second pinning region and the switchable region.

18. The spin-orbit torque magnetic memory device of claim 17, wherein the switchable magnetization direction is initialized to the second fixed magnetization direction, the magnetic layer is adapted to interact with the spin current to propagate the domain wall from the first pinning region towards the second pinning region to switch the switchable magnetization direction from the second fixed magnetization direction to the first fixed magnetization direction.

* * * * *